United States Patent
Kim et al.

(10) Patent No.: US 10,770,526 B2
(45) Date of Patent: Sep. 8, 2020

(54) DISPLAY DEVICE AND METHOD FOR MANUFACTURING THE SAME

(71) Applicant: Samsung Display Co., Ltd., Yongin-si, Gyeonggi-do (KR)

(72) Inventors: Min-jae Kim, Suwon-si (KR); Sukhoon Kang, Seoul (KR); Heera Kim, Suwon-si (KR); Beom-soo Shin, Hwaseong-si (KR); Hongyeon Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/246,269

(22) Filed: Jan. 11, 2019

(65) Prior Publication Data
US 2019/0221622 A1   Jul. 18, 2019

(30) Foreign Application Priority Data
Jan. 15, 2018   (KR) .................. 10-2018-0005246

(51) Int. Cl.
| | | |
|---|---|---|
| *H01L 27/32* | (2006.01) | |
| *H01L 51/50* | (2006.01) | |
| *H01L 51/00* | (2006.01) | |
| *H01L 51/52* | (2006.01) | |

(52) U.S. Cl.
CPC ...... *H01L 27/3246* (2013.01); *H01L 51/0005* (2013.01); *H01L 51/5012* (2013.01); *H01L 51/5056* (2013.01); *H01L 51/5284* (2013.01); *H01L 2227/323* (2013.01)

(58) Field of Classification Search
CPC ............ H01L 27/3246; H01L 51/0005; H01L 51/5012; H01L 51/5056; H01L 2227/323
USPC ......................................... 257/40
See application file for complete search history.

(56) References Cited

U.S. PATENT DOCUMENTS

| | | |
|---|---|---|
| 6,373,453 B1 | 4/2002 | Yudasaka |
| 6,380,672 B1 | 4/2002 | Yudasaka |
| 6,642,651 B2 | 11/2003 | Yudasaka |
| 6,755,983 B2 | 6/2004 | Yudasaka |
| 6,806,504 B2 | 10/2004 | Park |
| 6,830,494 B1 | 12/2004 | Yamazaki et al. |
| 6,838,192 B2 | 1/2005 | Miyashita et al. |
| 7,015,503 B2 | 3/2006 | Seki et al. |
| 7,214,959 B2 | 5/2007 | Seki et al. |
| 7,273,801 B2 | 9/2007 | Seki et al. |
| 7,291,970 B2 | 11/2007 | Kuwabara |
| 7,307,381 B2 | 12/2007 | Ito et al. |
| 8,431,182 B2 | 4/2013 | Kimura et al. |
| 8,592,239 B2 | 11/2013 | Fennimore et al. |

(Continued)

FOREIGN PATENT DOCUMENTS

| | | |
|---|---|---|
| KR | 10-1681454 B1 | 11/2016 |
| KR | 10-2017-0015700 A | 2/2017 |
| KR | 10-2017-0080237 A | 7/2017 |

*Primary Examiner* — Tu-Tu V Ho
(74) *Attorney, Agent, or Firm* — Lewis Roca Rothgerber Christie LLP

(57) ABSTRACT

A display device includes: a substrate including a circuit layer; a first electrode on the substrate; a first pixel defining layer on the substrate and having an opening exposing an upper surface of the first electrode; a second pixel defining layer on the first pixel defining layer and comprising an amphipathic material; an organic layer on the first electrode; and a second electrode on the organic layer.

13 Claims, 18 Drawing Sheets

(56) References Cited

U.S. PATENT DOCUMENTS 8,753,801 B2 6/2014 Saie et al.
2018/0182830 A1* 6/2018 Ko ..................... H01L 27/3246

\* cited by examiner

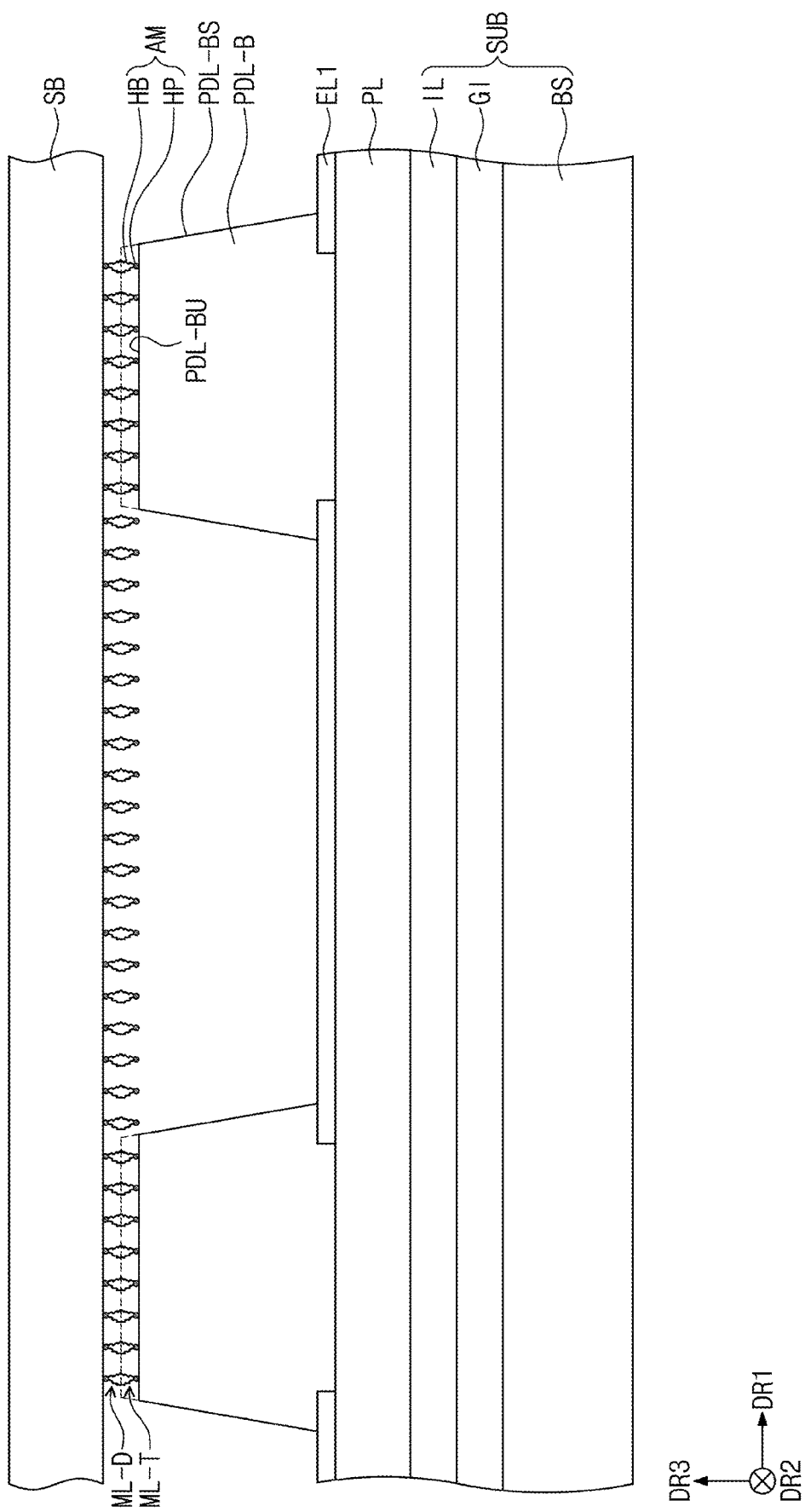

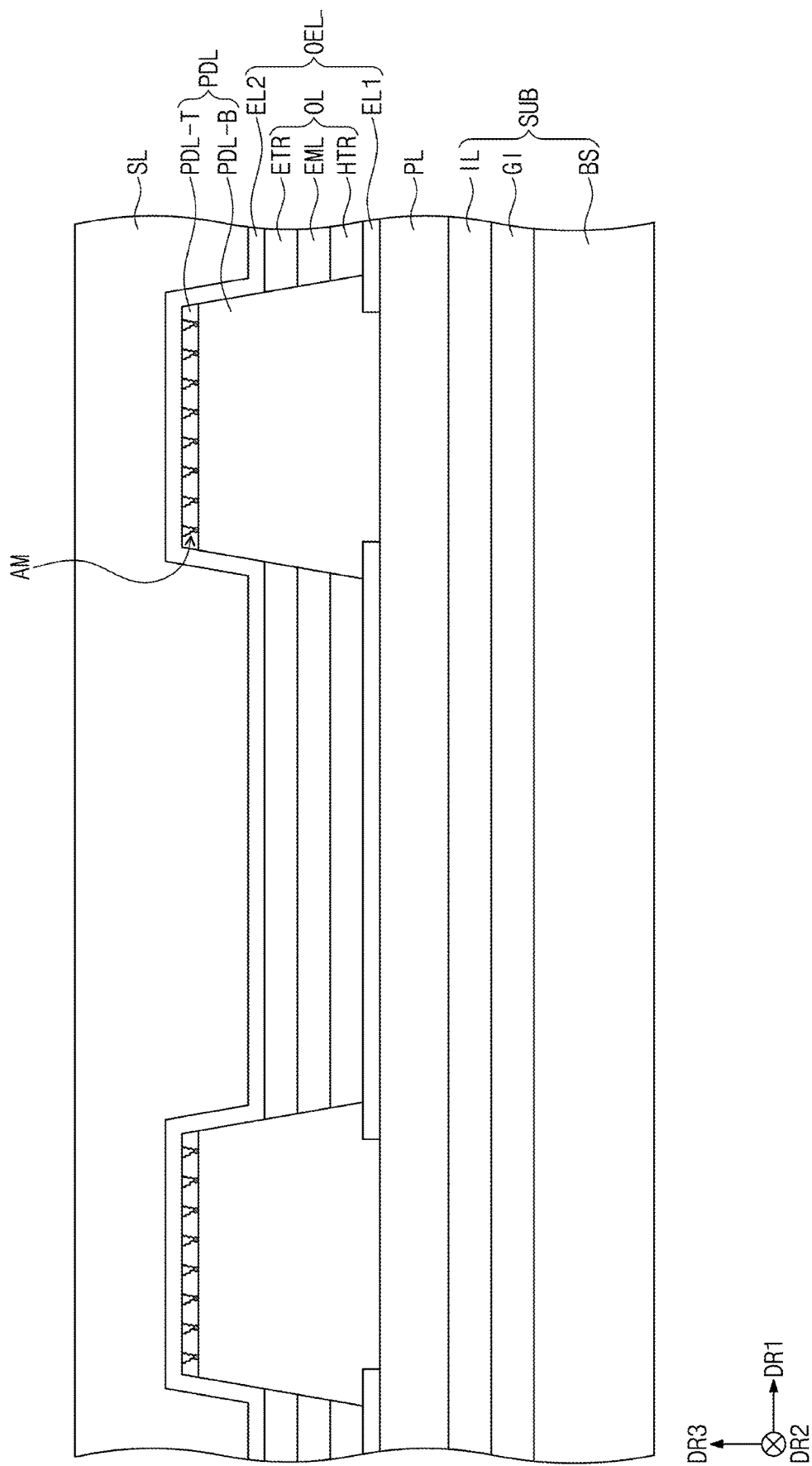

DISPLAY DEVICE AND METHOD FOR MANUFACTURING THE SAME

CROSS-REFERENCE TO RELATED APPLICATION

This application claims priority to and the benefit of Korean Patent Application No. 10-2018-0005246, filed on Jan. 15, 2018 in the Korean Intellectual Property Office (KIPO), the entire content of which is hereby incorporated by reference.

BACKGROUND

1. Field

Aspects of embodiments of the present disclosure relate to a display device and a method for manufacturing the same.

2. Description of Related Art

Various display devices for use with multimedia devices, such as televisions, mobile phones, tablet computers, navigation systems, game machines, etc., are being developed. One such display device, a display device including a self-luminous organic electroluminescence display panel, has been developed.

An organic electroluminescence display panel includes a first electrode, a second electrode, and one or more organic layers disposed between the first electrode and the second electrode. Recently, an inkjet printing method and the like have been introduced for forming the organic layers. However, when an organic layer is formed by an inkjet printing method, an organic material for forming the organic layer diffuses around a printing area.

SUMMARY

The present disclosure provides an organic electroluminescence display device having improved print quality of organic layers provided in an opening defined in a pixel defining layer.

The present disclosure also provides a manufacturing method of a display device providing improved print quality of organic layers in a pixel region partitioned by a pixel defining layer by providing the pixel defining layer with an amphipathic material such that the pixel defining layer has liquid-repellent properties after a plasma treatment step.

An embodiment of the present disclosure provides a display device including: a substrate including a circuit layer; a first electrode on the substrate; a first pixel defining layer on the substrate and having an opening exposing an upper surface of the first electrode; a second pixel defining layer on the first pixel defining layer and comprising an amphipathic material; an organic layer on the first electrode; and a second electrode on the organic layer.

The second pixel defining layer may be on an upper surface of the first pixel defining layer.

The amphipathic material may include a hydrophilic group and a hydrophobic group. The hydrophilic group may contact the upper surface of the first pixel defining layer and the hydrophobic group may define an upper surface of the second pixel defining layer.

A surface energy of the upper surface of the second pixel defining layer may be in a range of 10 dyne/cm to 30 dyne/cm.

A contact angle of water on the upper surface of the second pixel defining layer may be in a range of 100 degrees to 180 degrees.

The second pixel defining layer may be a monolayer including the amphipathic material.

A thickness of the second pixel defining layer may be in a range of 5 nm to 30 nm.

The organic layer may include a light emitting layer.

The first pixel defining layer may include a hydrophilic material.

The organic layer may be in the opening, and the organic layer may include a hole transport region, a light emitting layer on the hole transport region, and an electron transport region on the light emitting layer.

The second electrode may extend onto the first pixel defining layer and the second pixel defining layer.

Another embodiment of the present disclosure provides a display device including a plurality of organic electroluminescence devices and a pixel defining layer between the organic electroluminescence devices and defining a plurality of pixel regions. Each of the organic electroluminescence devices includes a first electrode, a second electrode facing the first electrode, and a light emitting layer between the first electrode and the second electrode. The pixel defining layer includes: a first pixel defining layer having a hydrophilic side surface and a hydrophilic upper surface; and a second pixel defining layer on the first pixel defining layer. The second pixel defining layer includes an amphipathic material, and an upper surface of the second pixel defining layer is hydrophobic.

The amphipathic material may include a hydrophilic group and a hydrophobic group, the hydrophilic group may contact the upper surface of the first pixel defining layer.

Another embodiment of the present disclosure provides method for manufacturing a display device. The method includes: forming a first electrode on a substrate, the substrate includes a circuit layer; forming a first pixel defining layer with an opening therein on the substrate; plasma treating the first pixel defining layer and the first electrode exposed by the opening; providing a second pixel defining layer including an amphipathic material onto the first pixel defining layer; and providing an organic layer on the first electrode.

The plasma treating of the first pixel defining layer and the first electrode may include providing a treatment gas comprising oxygen gas, nitrogen gas, argon gas, or a combination thereof onto the first pixel defining layer and the first electrode.

The providing of the second pixel defining layer may include transferring a monolayer including the amphipathic material onto an upper surface of the first pixel defining layer.

The method may further include high-temperature heat treating after the transferring of the monolayer.

The providing of the organic layer may include forming the organic layer by an inkjet printing method.

The organic layer may include a hole transport region, a light emitting layer, and an electron transport region sequentially laminated on the first electrode.

The hole transport region and the light emitting layer may be provided by an inkjet printing method, and the electron transport region may be provided by a deposition method.

BRIEF DESCRIPTION OF THE FIGURES

The accompanying drawings are included to provide a further understanding of the present disclosure and are incorporated in and constitute a part of this specification. The drawings illustrate exemplary embodiments of the present disclosure and, together with the description, further explain aspects and features of the present disclosure. In the drawings:

FIGS. 8A-8G are schematic views sequentially showing steps of a method for manufacturing a display device according to an embodiment.

DETAILED DESCRIPTION

Figure 1:
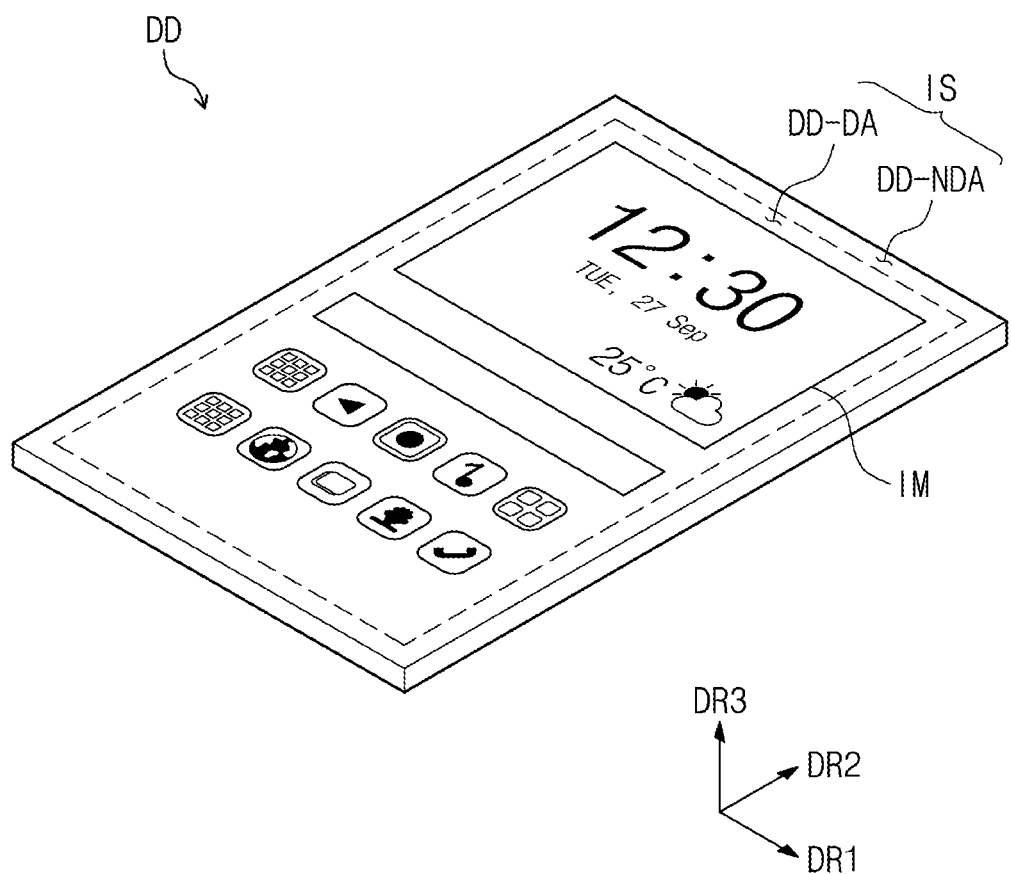
FIG. 1 is a perspective view of a display device according to an embodiment.

The present disclosure may be modified in many alternate forms, and thus, example embodiments will be exemplified in the drawings and described in detail. It should be understood, however, that these example embodiments are not intended to limit the present disclosure, but rather the present disclosure is intended to cover all modifications, equivalents, and alternatives falling within the spirit and scope of the present disclosure.

In describing each drawing, similar reference numerals are used for similar elements. Also, in the accompanying drawings, the dimensions of layers, structures, etc. may be exaggerated for clarity. It will be understood that, although the terms first, second, etc. may be used herein to describe various elements, these elements should not be limited by the terms. These terms are used only to distinguish one element from another. For example, a first element could be termed a second element, and similarly, a second element could be termed a first element without departing from the scope of the present disclosure. Terms of a singular form may include terms of a plural form unless the context clearly indicates otherwise.

In this application, the terms "include," "comprise," and "have," and variations thereof, are intended to designate features, numbers, steps, operations, elements, parts, or combinations thereof described in the specifications of the present disclosure but do not exclude the possibility of the presence or the addition of one or more other features, numbers, steps, operations, elements, parts, or combinations thereof.

It will also be understood that when a portion, such as a layer, a film, a region, or a plate, is referred to as being "on" or "over" another portion, it can be "directly on" the other portion or one or more intervening portions may be present therebetween. It will be understood that when a portion, such as a layer, a film, a region, or a plate, is referred to as being "under" another portion, it can be "directly under" the other portion or one or more intervening portions may be present therebetween.

In addition, the term "disposed" may include a case of being disposed at a lower portion as well as at an upper portion. Also, the term "directly disposed" means that there is no layer, film, region, plate, or the like, between a portion of the layer, the film, the region, the plate, or the like and the other portion(s). For example, "directly disposed" means disposed between two layers or two members without using additional members, such as an adhesive member and the like.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Hereinafter, a display device and a method for manufacturing a display device according to embodiments of the present disclosure will be described with reference to the accompanying drawings.

Figure 2:
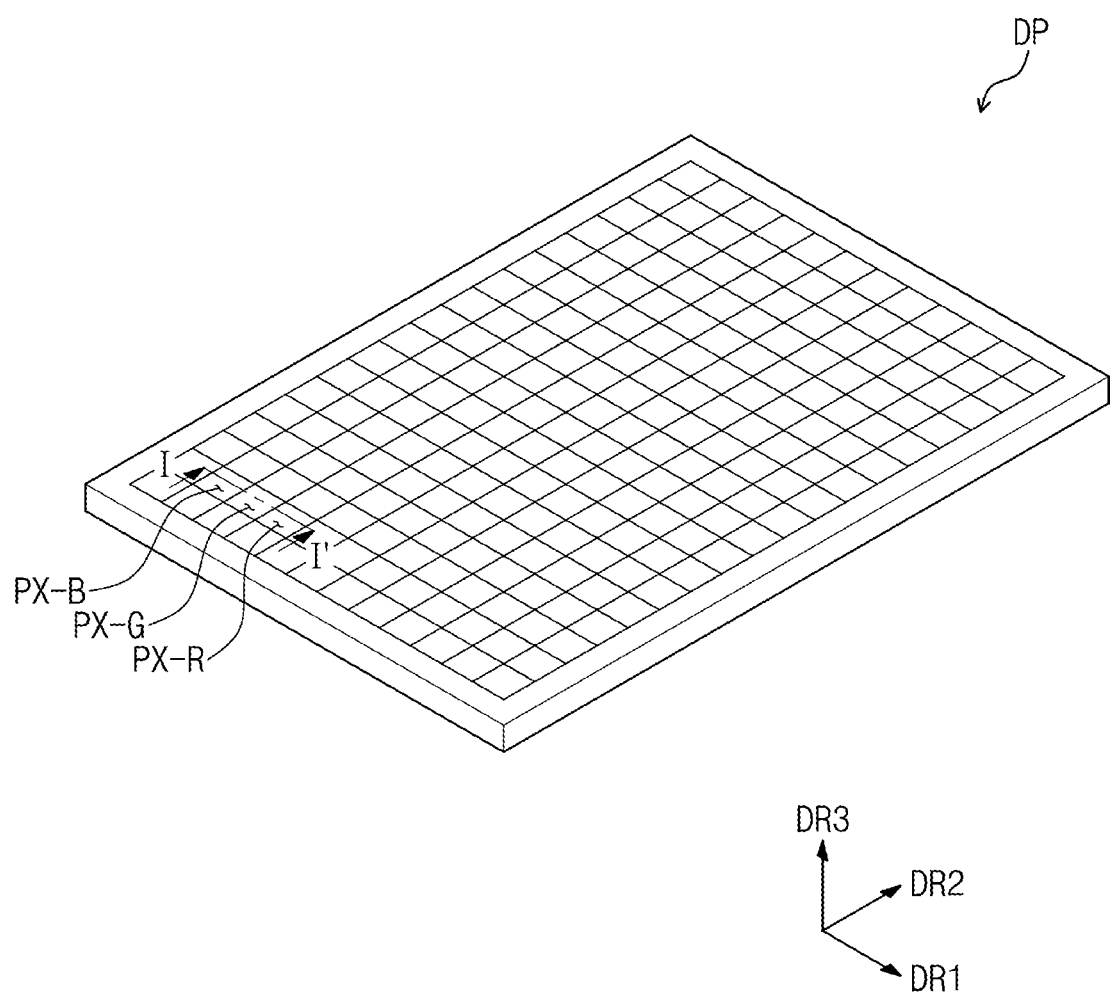
FIG. 2 is a perspective view schematically showing a display panel included in an organic electroluminescence display device according to an embodiment.

FIG. 1 is a perspective view of a display device according to an embodiment. FIG. 2 is a perspective view schematically showing a display panel included in an organic electroluminescence display device according to an embodiment.

Referring to FIG. 1, in a display device DD according to an embodiment, a display surface IS for providing (or displaying) an image IM to a user is parallel to a plane defined by a first direction axis DR1 and a second direction axis DR2. The normal direction of the display surface IS, that is, the thickness direction of the display device DD is indicated by a third direction axis DR3. The front surface (or upper surface) and the rear surface (or lower surface) of each various components and layers of the display device DD are distinguished by the third direction axis DR3. However, the directions indicated by the first to third direction axes DR1 to DR3 are relative concepts, and therefore, may be converted to other directions.

In addition, as illustrated in FIG. 1, the display surface IS of the display device DD may have a plurality of regions.

The display device DD may have a display area DD-DA in which the image IM is displayed and a non-display area DD-NDA which is adjacent to (e.g., surrounds a periphery of) the display area DD-DA. The non-display area DD-NDA is a region in which the image IM is not displayed. In FIG. 1, as an example of the image IM, application icons and a watch window are illustrated. The display area DD-DA may be square-shaped. The non-display area DD-NDA may be disposed to surround the display area DD-DA (e.g., to surround the periphery of the display area DD-DA). However, embodiments of the present disclosure are not limited thereto. The shape of the display area DD-DA and the shape of the non-display area DD-NDA may be designed relative to each other.

The display device DD may include a display panel DP (see, e.g., FIG. 2). The display device DD according to an embodiment may further include a window member disposed on the display panel DP. The window member protects the display panel DP and may provide an input window to a user. In addition, an optical member may be further disposed on the display panel DP. The optical member may be a polarizing member for blocking external light or for reducing reflectance or may be a color filter member having a color filter layer.

The display panel DP generates (or emits) an image and may provide the generated image to the front surface. The display panel DP may provide the generated image in the third direction axis DR3 (e.g., the image may be emitted along the third direction axis DR3). For example, the display panel DP may be an organic light emitting display panel. An organic light emitting display panel may be a display panel including an organic electroluminescence device.

The display panel DP may be a rigid display panel. In other embodiments, the display panel DP may be a flexible display panel. The display panel DP may include a flexible substrate. In the present specification, an element being flexible means that the element is able to be bent but is not limited to a structure that may be bent and completely folded and may include a structure that may bent a few nanometers.

FIG. 2 is a perspective view of the display panel DP included in the display device DD shown in FIG. 1.

As illustrated in FIG. 2, the display panel DP includes a plurality of pixels PX-B, PX-G, and PX-R. In FIG. 2, three types of pixels PX-B, PX-G, and PX-R are exemplarily illustrated, and the three types of pixels PX-B, PX-G, and PX-R may generate different color lights. For example, the three types of pixels PX-B, PX-G, and PX-R may respectively emit blue light, green light, and red light. In other embodiments, the pixels may respectively emit cyan light, yellow light, and magenta light. In other embodiments, the pixels may generate light having the same color. The three types of pixels PX-B, PX-G, and PX-R may generate (or emit) light in the third direction axis DR3 of FIG. 2.

For example, the three types of pixels PX-B, PX-G, and PX-R may be arranged in a matrix form on a plane defined by the first direction axis DR1 and the second direction axis DR2. In addition, each of the three types of pixels PX-B, PX-G, and PX-R may be arranged in columns extending along the second direction axis DR2. However, embodiments of the present disclosure are not limited thereto, and the arrangement of the pixels may be variously, suitably modified according to a method for implementing a display panel. In addition, each of the pixels PX-B, PX-G, and PX-R generating different color lights may be defined as a sub-pixel, and a combination of the sub-pixels (e.g., one of each of the sub-pixels PX-B, PX-G, and PX-R) may be defined as a pixel PX.

The pixel PX according to an embodiment of the present disclosure may correspond to an organic electroluminescence device to be further described later. In addition, the three types of pixels PX-B, PX-G, and PX-R may respectively correspond to an organic electroluminescence device having light emitting layers for emitting light having different wavelengths (e.g., different wavelength regions).

Figure 3:
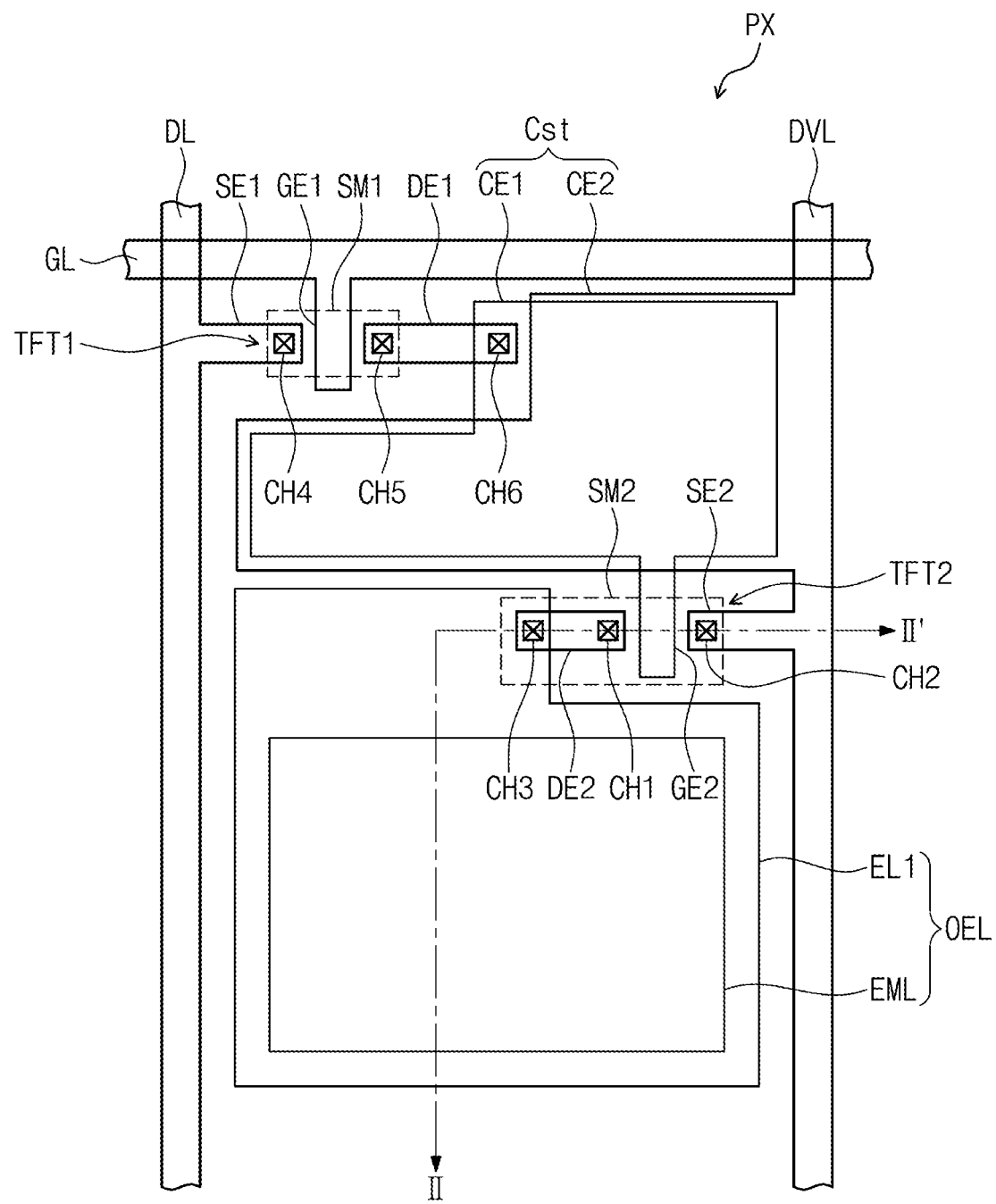
FIG. 3 is a plan view showing a pixel included in the display device according to an embodiment.
Figure 3:
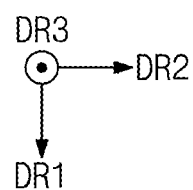
Figure 4:
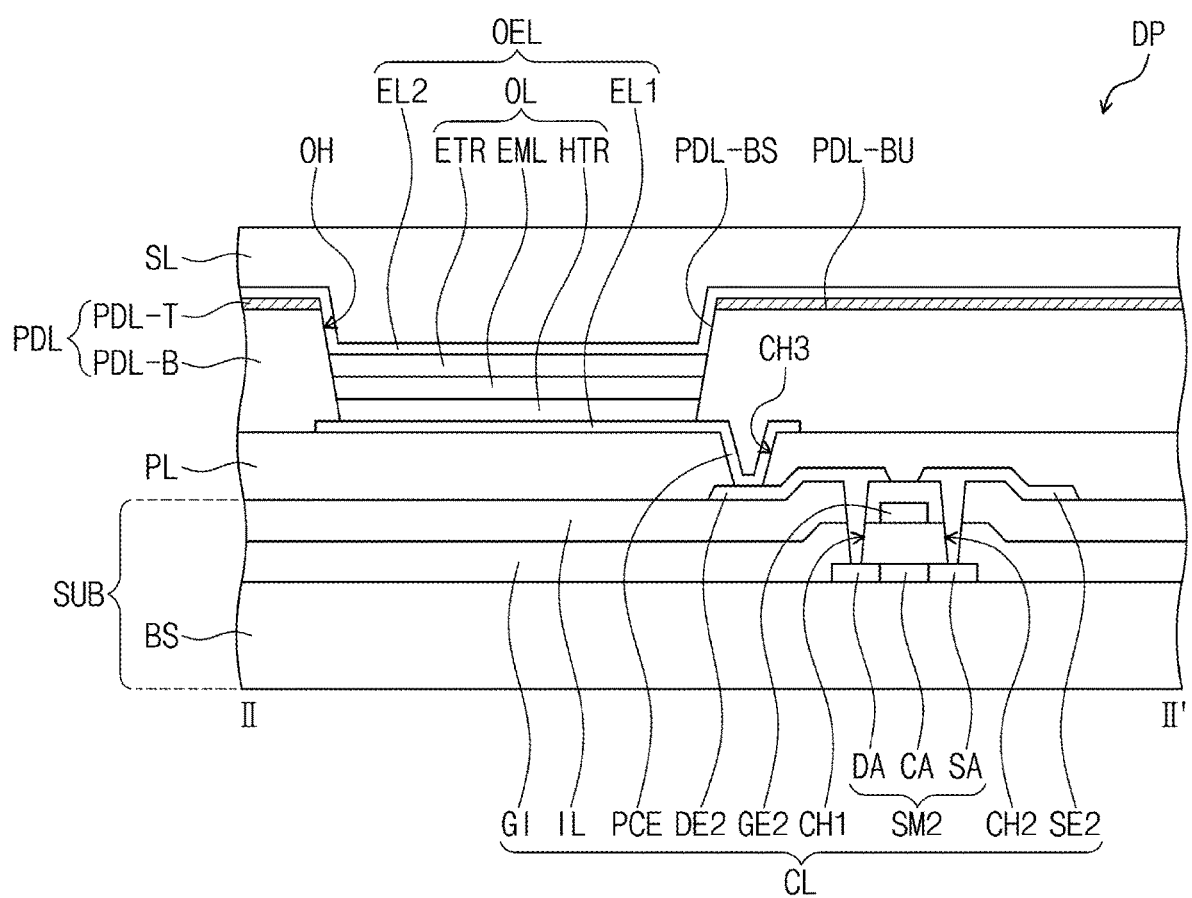
FIG. 4 is a cross-sectional view taken along the line II-II' of FIG. 3.
Figure 5:
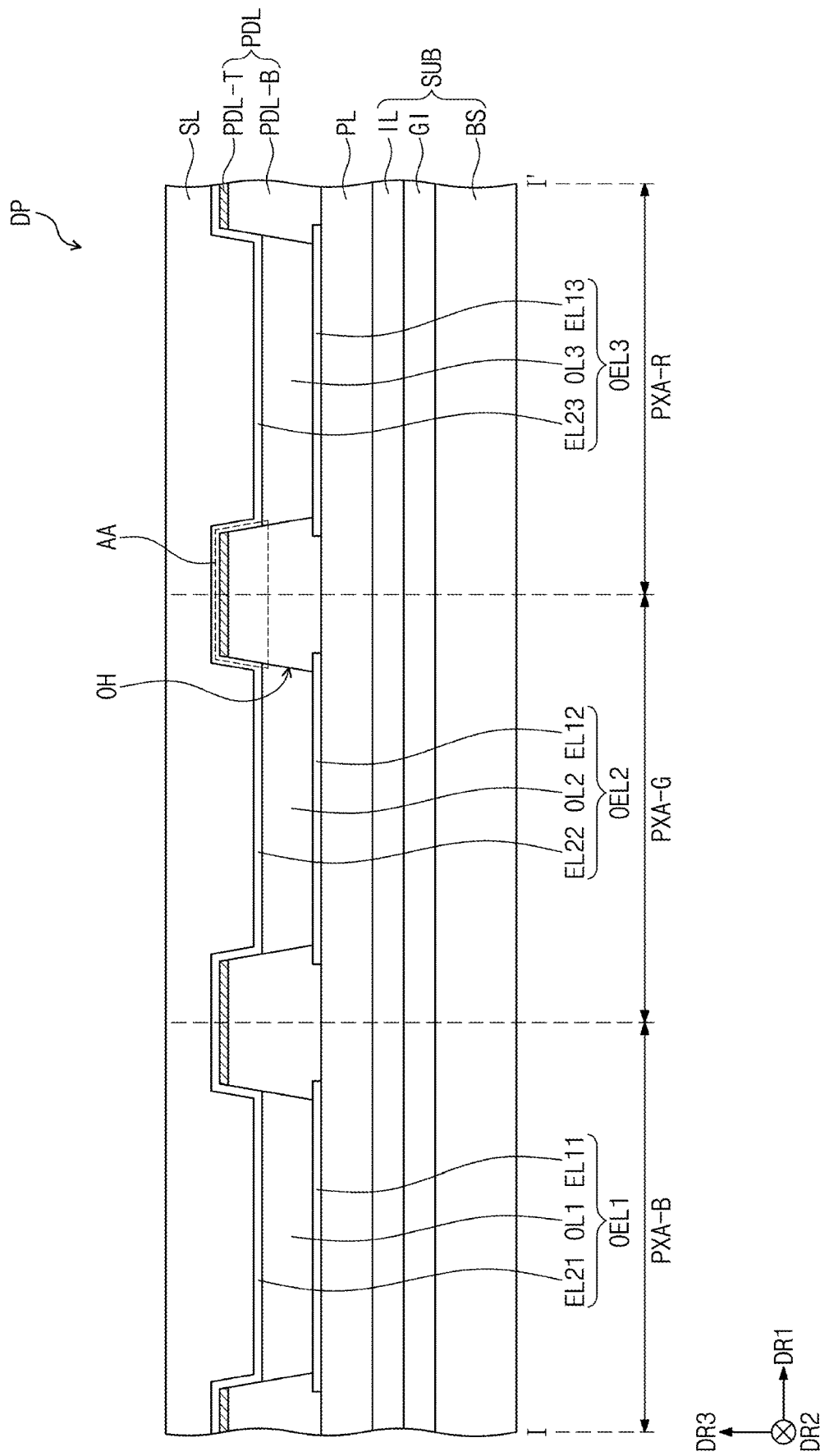
FIG. 5 is a cross-sectional view taken along the line I-I' of FIG. 2.

FIG. 3 is a plan view showing one of the pixels (e.g., one of the sub-pixels) included in the display panel DP (see, e.g., FIG. 2) of a display device according to an embodiment. FIG. 4 is a cross-sectional view showing a region taken along the line II-II' of FIG. 3, and FIG. 5 is a cross-sectional view of a region of the display panel taken along the line I-I' of FIG. 2.

The pixel PX shown in FIG. 3 may be any one of the three types of pixels PX-B, PX-G, and PX-R of the display panel DP illustrated in FIG. 2. The pixel PX may be connected to a wiring portion including a gate line GL, a data line DL, and a driving voltage line DVL. The pixel PX includes thin film transistors TFT1 and TFT2 connected to the wiring portion, an organic electroluminescence device OEL connected to the thin film transistors TFT1 and TFT2, and a capacitor Cst.

In an embodiment, one pixel PX is exemplarily illustrated as being connected to one gate line GL, one data line DL, and one driving voltage line DVL, but embodiments of the present disclosure are not limited thereto. A plurality of pixels PX may be connected to one gate line GL, one data line DL, and one driving voltage line DVL. In other embodiments, one pixel PX may be connected to one or more gate lines GL, one or more data lines DL, and one or more driving voltage lines DVL.

The gate line GL extends in the first direction axis DR1. The data line DL extends in the second direction axis DR2 and crosses the gate line GL. The driving voltage line DVL extends in substantially the same direction as that of the data line DL, that is, the second direction axis DR2. The gate line GL transmits a scanning signal to the thin film transistors TFT1 and TFT2. The data line DL transmits a data signal to the thin film transistors TFT1 and TFT2. The driving voltage line DVL provides driving voltage to the thin film transistors TFT1 and TFT2.

The thin film transistor TFT2 may be a driving thin film transistor TFT2 for controlling the organic electroluminescence device OEL, and the thin film transistor TFT1 may be a switching thin film transistor TFT1 for switching the driving thin film transistor TFT2. In an embodiment of the present disclosure, one pixel PX is described as including the two thin film transistors TFT1 and TFT2, but embodiments are not limited thereto. One pixel PX may include one thin film transistor and one capacitor, or in other embodiments, one pixel PX may include three or more thin film transistors and two or more capacitors.

The switching thin film transistor TFT1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a first common electrode CE1 through a fifth contact opening (e.g., contact hole) CH5. The switching thin film transistor TFT1 transmits the data signal applied to the data line DL to the driving thin film transistor TFT2 according to the scanning signal applied to the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to the first electrode EL1 through an electrode connection opening (e.g., connection hole) CH3.

The first electrode EL1 is connected to the second drain electrode DE2 of the driving thin film transistor TFT2. A common voltage is applied to a second electrode EL2 (see, e.g., FIG. 4), and a light emitting layer EML displays an image by emitting light according to an output signal of the driving thin film transistor TFT2. The first electrode EL1, the second electrode EL2, and the light emitting layer EML will be described in more detail later.

The capacitor Cst is connected between the second gate electrode GE2 and the second source electrode SE2 of the driving thin film transistor TFT2 and charges and maintains a data signal inputted to the second gate electrode GE2 of the driving thin film transistor TFT2. The capacitor Cst may include the first common electrode CE1 connected to the first drain electrode DE1 through a sixth contact opening (e.g., contact hole) CH6 and a second common electrode CE2 connected to the driving voltage line DVL.

Referring to FIG. 4, the display device DP included in a display device according to an embodiment may include the organic electroluminescence device OEL. In an embodiment, the display panel DP may include a pixel defining layer PDL for defining a light emitting region of the organic electroluminescence device OEL. In addition, in the display panel DP, the organic electroluminescence device OEL is disposed on a substrate SUB, and the display panel DP may further include a sealing layer SL disposed on the organic electroluminescence device OEL.

The substrate SUB of the display panel DP may include a circuit layer CL. The substrate SUB may include a base substrate BS, and the circuit layer CL may be disposed on the base substrate BS. Referring to FIGS. 3 and 4, the circuit layer CL may include the gate line GL, the data line DL, the driving voltage line DVL, the thin film transistors TFT1 and TFT2, semiconductor patterns SM1 and SM2, and the capacitor Cst. In addition, the circuit layer CL may include a gate insulating layer GI and an interlayer insulating layer IL.

The base substrate BS is not particularly limited and any suitable substrate may be used. The base substrate BS may be a flexible substrate. The base substrate BS may made of glass or may be a plastic substrate including a polymer resin. For example, the base substrate BS may include polyethylene terephthalate (PET), polyethylene naphthalate (PEN), polyimide, polyether sulfone, or the like. The base substrate BS may be selected in consideration of mechanical strength, thermal stability, transparency, surface smoothness, ease of handling, water resistance, and the like thereof. The base substrate BS may be transparent, but embodiments of the present disclosure are not limited thereto.

A substrate buffer layer may be provided on the base substrate BS. The substrate buffer layer prevents or substantially prevents impurities from diffusing into the switching thin film transistor TFT1 and the driving thin film transistor TFT2. The substrate buffer layer may be formed of or may include silicon nitride ($SiN_x$), silicon oxide ($SiO_x$), silicon oxynitride ($SiO_xN_y$), or the like or may be omitted according to the material and processing conditions, of the base substrate BS.

The first semiconductor pattern SM1 and the second semiconductor pattern SM2 are provided on the base substrate BS. The first semiconductor pattern SM1 and the second semiconductor pattern SM2 are formed of a semiconductor material and respectively act as an active layer of the switching thin film transistor TFT1 and of the driving thin film transistor TFT2. Each of the first semiconductor pattern SM1 and the second semiconductor pattern SM2 includes a source area SA, a drain area DA, and a channel area CA provided between the source area SA and the drain area DA. Each of the first semiconductor pattern SM1 and the second semiconductor pattern SM2 may be formed of any suitable material selected from an inorganic semiconductor or an organic semiconductor. The source area SA and the drain area DA may be doped with an n-type impurity or a p-type impurity.

The gate insulating layer GI is provided on the first semiconductor pattern SM1 and the second semiconductor pattern SM2. The gate insulating layer GI covers the first semiconductor pattern SM1 and the second semiconductor pattern SM2. The gate insulating layer GI may be formed of an organic insulating material or an inorganic insulating material.

The first gate electrode GE1 and the second gate electrode GE2 are provided on the gate insulating layer GI. The first gate electrode GE1 and the second gate electrode GE2 are provided to respectively cover an area corresponding to the drain area DA of the first semiconductor pattern SM1 and the drain area DA of the second semiconductor pattern SM2.

The interlayer insulating layer IL is disposed on the first gate electrode GE1 and the second gate electrode GE2. The interlayer insulating layer IL covers the first gate electrode GE1 and the second gate electrode GE2. The interlayer insulating layer IL may be formed of an organic insulating material or an inorganic insulating material.

The first source electrode SE1, the first drain electrode DE1, the second source electrode SE2, and the second drain electrode DE2 are disposed on the interlayer insulating layer IL. The second drain electrode DE2 contacts the drain area DA of the second semiconductor pattern SM2 through a first contact opening (e.g., contact hole) CH1 formed on the gate insulating layer GI and the interlayer insulating layer IL. The second source electrode SE2 contacts the source area SA of the second semiconductor SM2 through a second contact opening (e.g., contact hole) CH2 formed on the gate insulating layer GI and an interlayer insulating layer IL. The first source electrode SE1 contacts a source area of the first semiconductor pattern SM1 through a fourth contact opening (e.g., contact hole) CH4 formed on the gate insulating layer GI and the interlayer insulating layer IL. The first drain electrode DE1 contacts a drain area of the first semiconductor pattern SM1 through the fifth contact opening (e.g., contact hole) CH5 formed on the gate insulating layer GI and the interlayer insulating layer IL.

An insulating layer PL is disposed on the substrate SUB. The insulating layer PL may be provided on the first source electrode SE1, the first drain electrode DE1, the second source electrode SE2, and the second drain electrode DE2. In a display device according to an embodiment, the electrode connecting opening CH3 may be defined in the insulating layer PL. The first electrode EL1 of the organic electroluminescence device OEL is disposed extending into the electrode connecting opening CH3 and may be connected to the second drain electrode DE2 of the circuit layer CL.

The first electrode EU of the organic electroluminescence device OEL may be disposed on the substrate SUB. Also, referring to FIG. 4, the first electrode EL1 may be disposed on the insulating layer PL.

In an embodiment, the display panel DP may include the pixel defining layer PDL disposed on the substrate SUB. The pixel defining layer PDL includes a first pixel defining layer PDL-B and a second pixel defining layer PDL-T, and the second pixel defining layer PDL-T may be disposed on (e.g., disposed over) the first pixel defining layer PDL-B. The second pixel defining layer PDL-T may include an amphipathic material. The first pixel defining layer PDL-B and the second pixel defining layer PDL-T will be described in more detail later.

An organic layer OL may be disposed in an opening OH defined in the first pixel defining layer PDL-B. The organic electroluminescence device OEL including the first electrode EL1, the organic layer OL, and the second electrode EL2 may be sequentially laminated in the third direction axis DR3 which is a thickness direction, on the substrate SUB. In an embodiment, the organic layer OL may include, for example, a hole transport region HTR, the light emitting layer EML, and an electron transport region ETR.

The first electrode EL1 of the organic electroluminescence device OEL may be formed of or may include a metal alloy or a conductive compound. The first electrode EL1 may be an anode. The first electrode EL1 may be a pixel electrode. As described above, the first electrode EL1 may be electrically connected to the circuit layer CL through the electrode connecting opening CH3 formed on the insulating layer PL. In the display panel DP of a display device according to an embodiment, the first electrode EL1 may be a reflective electrode, but embodiments of the present disclosure are not limited thereto. For example, the first electrode EL1 may be a transmissive electrode or a transflective electrode. When the first electrode EU is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), lithium fluoride/calcium (LiF/Ca), lithium fluoride/aluminum (LiF/Al), molybdenum (Mo), titanium (Ti), or a compound or a mixture thereof (for example, a mixture of Ag and Mg). In some embodiments, the first electrode EL1 may have a multilayer structure including a reflective film or a transflective film, both formed of one or more of above-listed materials, and a transparent conductive film formed of indium tin oxide (ITO), indium zinc oxide (IZO), zinc oxide (ZnO), indium tin zinc oxide (ITZO), or the like.

The organic layer OL may be disposed on the first electrode EL1. The organic electroluminescence device OEL may include the hole transport region HTR disposed on the first electrode EL1, the light emitting layer EML disposed on the hole transport region HTR, and the electron transport region ETR disposed on the light emitting layer EML The hole transport region HTR may have a single layer structure having a single layer formed of a single material, a single layer structure having a single layer formed of a plurality of different materials, or a multilayer structure having a plurality of layers formed of a plurality of different materials. For example, the hole transport region HTR may have a single layer structure having a single layer formed of a plurality of different materials or may include a hole injection layer/a hole transport layer, a hole injection layer/a hole transport layer/a buffer layer, a hole injection layer/a buffer layer, a hole transport layer/a buffer layer, or hole injection layer/a hole transport layer/an electron blocking layer sequentially laminated on the first electrode EL1, but embodiments of the present disclosure are not limited thereto.

For example, the hole transport region HTR may include a hole injection layer and a hole transport layer. A suitable hole injection material and a suitable hole transport material known in the art may be used in the hole injection layer and the hole transport layer, respectively.

The light emitting layer EML is provided on the hole transport region HTR. The light emitting layer EML may have a single layer structure having a single layer formed of a single material, a single layer structure having a single layer formed of a plurality of different materials, or a multilayer structure having a plurality of layers formed of a plurality of different materials.

The light emitting layer EML is not particularly limited and any suitable material may be used. For example, the light emitting layer EML may be formed of materials for emitting red, green, and blue light and may include a fluorescent material or a phosphorescent material. In addition, the light emitting layer EML may include a host and a dopant. For example, the light emitting layer EML may include different light emitting materials in each of the pixels (e.g., PX-B, PX-G, and PX-R in FIG. 2) for generating different color lights.

The electron transport region ETR is provided on the light emitting layer EML. The electron transport region ETR may include at least one of a hole blocking layer, an electron transport layer, or an electron injection layer but is not limited thereto. When the electron transport region ETR includes an electron injection layer and an electron transport layer, a suitable electron injection material and a suitable electron transport material known in the art may be respectively used in the electron injection layer and the electron transport layer.

The second electrode EL2 is provided on the electron transport region ETR. The second electrode EL2 may be a common electrode or a cathode. The second electrode EL2 may be formed of a metal alloy or a conductive compound. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), or the like.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some embodiments, the second electrode EL2 may have a multilayer structure including a reflective film or a transflective film, both formed of or including one or more of the above-listed materials, and a transparent conductive film formed of or including indium tin oxide (ITO), indium zinc oxide (IZO), zinc oxide (ZnO), indium tin zinc oxide (ITZO), and the like.

Referring to FIG. 4, the second electrode EL2 may be disposed not only in a region overlapping the first electrode EL1 but may extend to be on the pixel defining layer PDL. That is, the second electrode EL2 may extend onto the first pixel defining layer PDL-B and the second pixel defining layer PDL-T, which is disposed over (e.g., disposed overlapping) the first pixel defining layer PDL-B. The second electrode EL2 may be connected to an auxiliary electrode. When the second electrode EL2 is connected to the auxiliary electrode, the resistance of the second electrode EL2 may be reduced.

The sealing layer SL may be provided on the second electrode EL2. The sealing layer SL may be disposed covering the second electrode EL2. The sealing layer SL may be one layer or a plurality of laminated layers. The sealing layer SL may include at least one layer of an organic layer or an inorganic layer. In some embodiments, the sealing layer SL may include at least one organic layer and at least one inorganic layer.

The sealing layer SL may be, for example, a thin film sealing layer. The sealing layer SL protects the organic electroluminescence device OEL. The sealing layer SL covers an upper surface of the second electrode EL2 disposed in the opening OH and may fill the opening OH (e.g., may fill the remaining space of the opening OH). In some embodiments, the sealing layer SL may be omitted and a separate sealing member may be added on the organic electroluminescence device OEL.

Figure 6A:
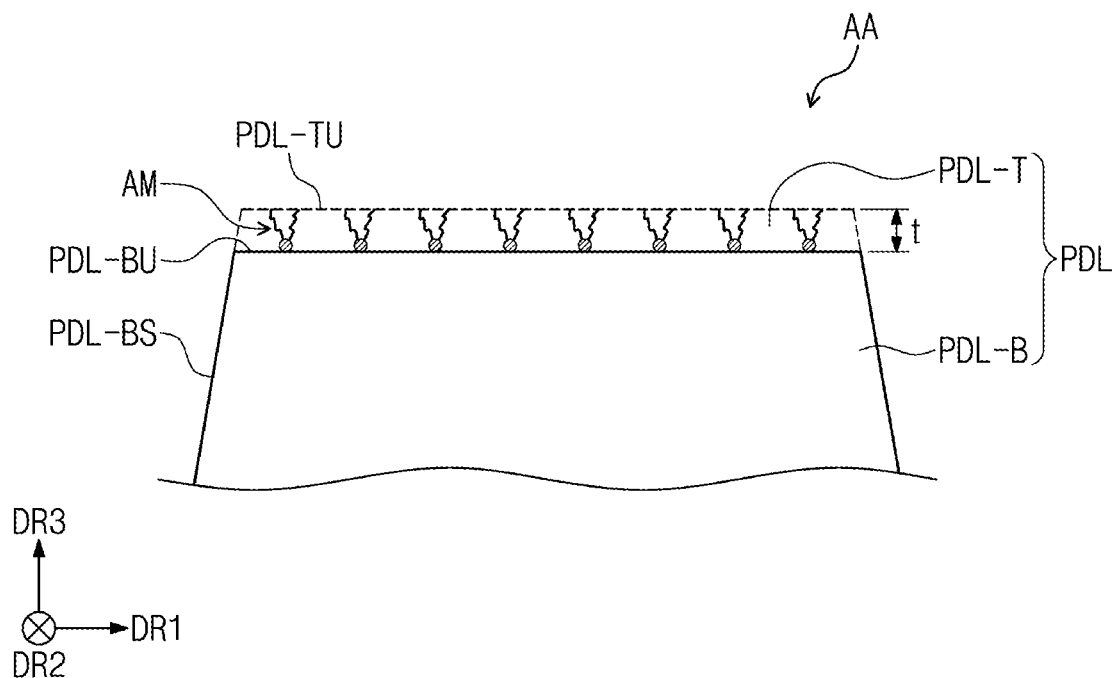
FIG. 6A is a cross-sectional view showing the region AA of FIG. 5 in more detail.
Figure 6B:
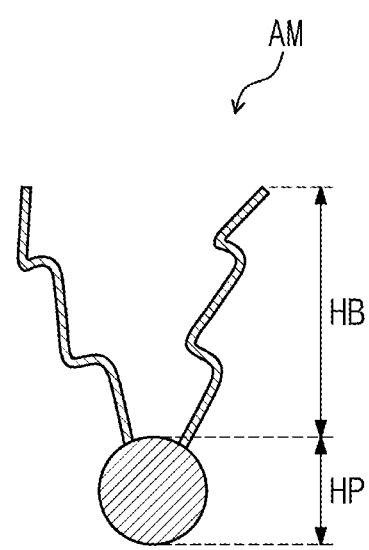
FIG. 6B is a view schematically showing an amphipathic material.

FIG. 5 is a cross-sectional view of a display panel included in a display device according to an embodiment. FIG. 5 may be a cross-sectional view taken along the line I-I' of the display panel DP illustrated in FIG. 2. FIG. 6A is a cross-sectional view showing the region AA of FIG. 5 in more detail, and FIG. 6B is a schematic view showing an amphipathic material AM included in the second pixel defining layer PDL-T of FIG. 6A in more detail.

Referring to the cross-sectional view of FIG. 5, in a display device according to an embodiment, the display panel DP may include the base substrate BS, the gate insulating layer GI, the interlayer insulating layer IL, the insulating layer PL, the pixel defining layer PDL, organic electroluminescence devices OEL1, OEL2, and OEL3, and the sealing layer SL.

The display panel DP may include a plurality of pixel regions PXA-B, PXA-G, and PXA-R. For example, the display panel DP may include a first pixel region PXA-B, a second pixel region PXA-G, and a third pixel region PXA-R, each emitting light having different wavelengths. In the embodiment illustrated in FIG. 5, the first pixel region PXA-B may be a blue pixel region, the second pixel region PXA-G may be a green pixel region, and the third pixel region PXA-R may be a red pixel region. That is, in an embodiment, the display panel DP may include a blue pixel region, a green pixel region, and a red pixel region. For example, a blue pixel region is a blue light emitting region for emitting blue light, and a green pixel region and a red pixel region respectively represent a green light emitting region and a red light emitting region. The pixel regions PXA-B, PXA-G, and PXA-R may be light emitting regions respectively corresponding to the plurality of pixels PX-B, PX-G, and PX-R in the above description with reference to FIG. 2.

The first pixel region PXA-B may be a region in which a first organic electroluminescence device OEL1 having a first organic layer OL1 is disposed. Also, the second pixel region PXA-G and the third pixel region PXA-R may regions in which a second organic electroluminescence device OEL2 and a third organic electroluminescence device OEL3 are disposed, respectively.

For example, the first organic electroluminescence device OEL1 may include a first electrode EL11, the first organic layer OL1, and a second electrode EL21. The first organic layer OL1 may include a hole transport region, a light emitting layer, and an electron transport region as the organic electroluminescence device OEL described with reference to FIG. 4. For example, the first organic layer OL1 may include a light emitting layer for emitting blue light. The second organic electroluminescence device OEL2 may include a first electrode EL12, a second organic layer OL2, and a second electrode EL22. The third organic electroluminescence device OEL3 may include a first electrode EL13, a third organic layer OL3, and a second electrode EL23. The second organic layer OL2 and the third organic layer OL3 may respectively include a light emitting layer for emitting green light and red light. In addition, the second organic layer OL2 and the third organic layer OL3 may respectively include a hole transport region, a light emitting layer, and an electron transport region as the organic electroluminescence device OEL described with reference to FIG. 4.

In an embodiment, each of the first to third organic electroluminescence devices OEL1, OEL2, and OEL3 may emit light having a specific color, for example, one of blue light, green light, and red light. However, the colors of the emitted light are not limited thereto. For example, cyan light, magenta light, yellow light, and the like may be added thereto.

Also, in an embodiment, the first to third organic electroluminescence devices OEL1, OEL2, and OEL3 may emit light having the same or substantially the same wavelength (e.g., the same or substantially the same wavelength region). In an embodiment, each of the first to third organic electroluminescence devices OEL1, OEL2, and OEL3 may include a plurality of light emitting layers laminated in the third direction axis DR3, which is a thickness direction. The plurality of light emitting layers may respectively emit light in different wavelength regions, or two or more light emitting layers may emit light in different wavelength regions, or all of the light emitting layers may emit light in the same or substantially the same wavelength region.

In the display panel DP, the first pixel defining layer PDL-B may be disposed on the substrate SUB. Referring to FIGS. 4 and 5, the first pixel defining layer PDL-B may be disposed on the insulating layer PL. In an embodiment, the opening OH may be defined in the first pixel defining layer PDL-B included in the display panel DP. The first pixel defining layer PDL-B may have the opening OH for exposing the first electrode EL1. The first pixel defining layer PDL-B may partition the organic electroluminescence device OEL so as to correspond to each of the pixels PX.

The first pixel defining layer PDL-B may include a hydrophilic material. For example, the first pixel defining layer PDL-B may be formed of a polymer resin. For example, the first pixel defining layer PDL-B may include a polyacrylate-based resin or a polyimide-based resin. Also, the first pixel defining layer PDL-B may further include an inorganic material in addition to the polymer resin. The first pixel defining layer PDL-B may exhibit hydrophilicity. An upper surface PDL-BU and a side surface PDL-BS of the first pixel defining layer PDL-B may exhibit hydrophilicity.

The first pixel defining layer PDL-B may include a light absorbing material or may include a black pigment or a black dye. The first pixel defining layer PDL-B including a black pigment or a black dye may implement a black pixel defining layer. Carbon black and the like may be used as a black pigment or a black dye when the first pixel defining layer PDL-B is formed, but embodiments of the present disclosure are not limited thereto.

Also, the first pixel defining layer PDL-B may include an inorganic material. For example, the first pixel defining layer PDL-B may include silicon nitride ($SiN_x$), silicon oxide ($SiO_x$), silicon oxide ($SiO_xN_y$), or the like.

Referring to FIGS. 4-6B, in an embodiment, the pixel defining layer PDL of the display panel DP may include the second pixel defining layer PDL-T disposed on the upper surface PDL-BU of the first pixel defining layer PDL-B. The second pixel defining layer PDL-T may include the amphipathic material AM including both a hydrophilic group HP and a hydrophobic group HB. In the second pixel defining layer PDL-T, the hydrophilic group HP of the amphipathic material AM may be disposed contacting (e.g., may be disposed directly on) the upper surface PDL-BU of the first pixel defining layer PDL-B. Also, the hydrophobic group HB of the amphipathic material AM may define an upper surface PDL-TU of the second pixel defining layer PDL-T. For example, the amphipathic material AM may be aligned such that the hydrophilic group HP contacts (e.g., directly contacts) the upper surface PDL-BU of the first pixel defining layer PDL-B and the hydrophobic group HB is spaced from the upper surface PDL-BU of the first pixel defining layer PDL-B (e.g., the hydrophilic group HP may be between the upper surface PDL-BU of the first pixel defining layer PDL-B and the hydrophobic group HB).

The amphipathic material AM illustrated in FIG. 6B is illustrated to distinguish between the hydrophilic group HP and the hydrophobic group HB, and the shapes of the hydrophilic group HP and the hydrophobic group HB are not limited to the shapes illustrated in FIG. 6B. In FIG. 6B, the length of the hydrophobic group HB is illustrated as being greater than the length of the hydrophilic group HP, but embodiments of the present disclosure are not limited thereto. The length of the hydrophobic group HB and the length of the hydrophilic group HP may be the same or substantially the same. Also, in FIG. 6B, the hydrophobic group HB is illustrated as being divided into two branches, but this is only an example. Embodiments of the present disclosure are not limited thereto.

In the amphipathic material AM, the hydrophilic group HP may be distinguished as a head part and the hydrophobic group HB may be distinguished as a tail part. Also, in the amphipathic material AM, the hydrophilic group HP may include a hydroxyl group (OH group), a carboxyl group (COOH group), an amino group ($NH_2$ group), or other hydrophilic functional groups, and the hydrophobic group HB may be an aliphatic chain.

For example, in an embodiment, the hydrophilic group HP of the amphipathic material AM is a carboxyl group (COOH group) and may be at least one of palmitic acid, margaric acid, stearic acid, nonadecanoic acid, or arachidic acid, which are shown in Compound Group 1 below.

Compound Group 1:

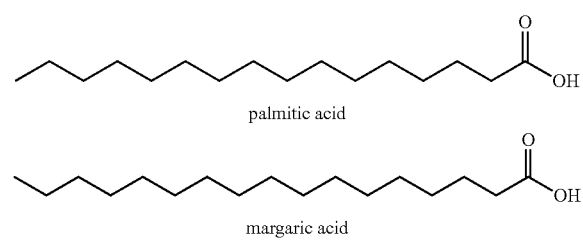

palmitic acid margaric acid

-continued

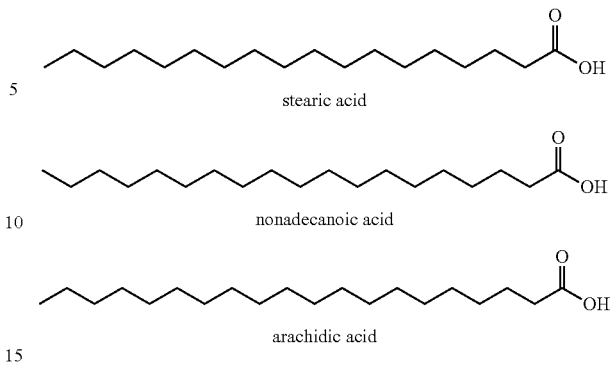

stearic acid nonadecanoic acid arachidic acid

In an embodiment, the hydrophilic group HP of the amphipathic material AM includes an amino group ($NH_2$ group) and may be at least one of hexadecanamide, heptadecanamide, Kemamide® (a registered trademark of PMC BIOGENIX, INC. of Mr. Laurel, N.J.), or nonadecanamide, which are shown in Compound Group 2 below.

Compound Group 2:

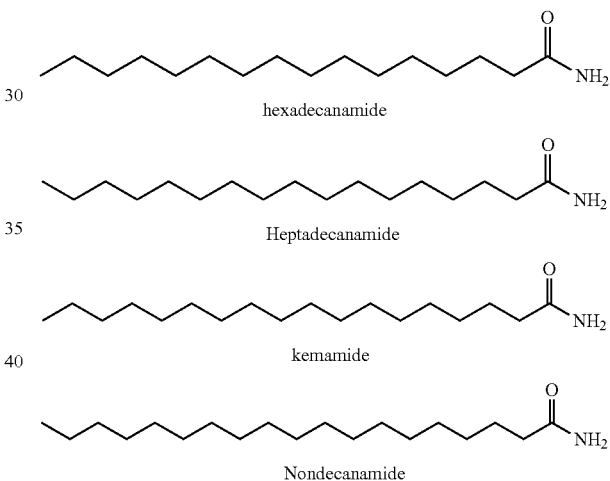

hexadecanamide

Heptadecanamide kemamide

Nondecanamide

In addition, in an embodiment, the amphipathic material AM may be at least one of the compounds shown in Compound Group 3 below.

Compound Group 3:

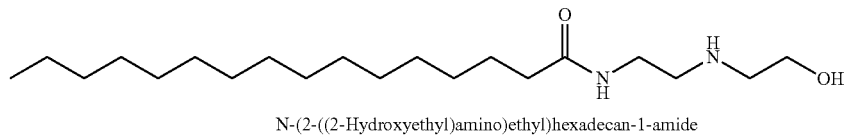

N-(2-((2-Hydroxyethyl)amino)ethyl)hexadecan-1-amide

-continued

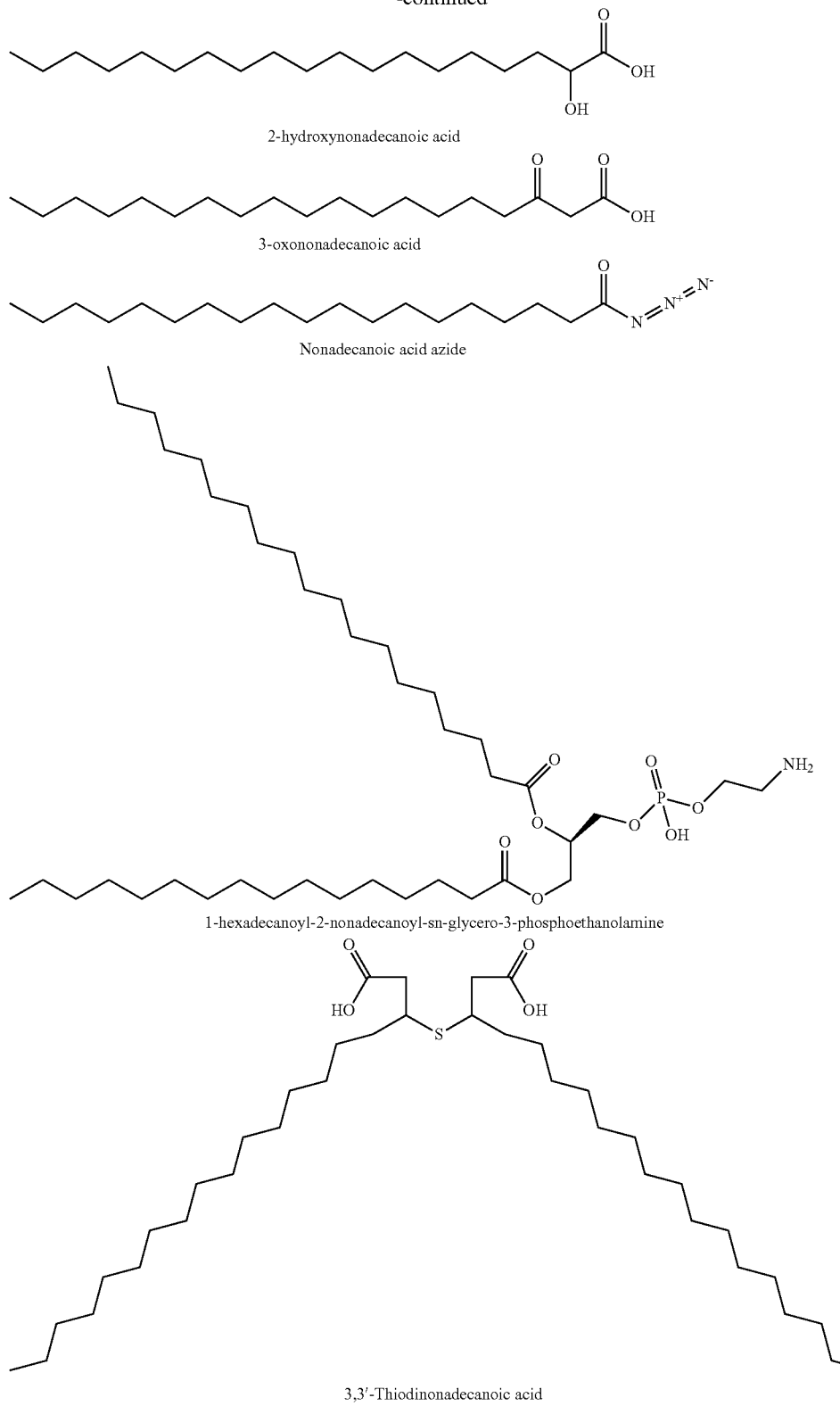

2-hydroxynonadecanoic acid 3-oxononadecanoic acid

Nonadecanoic acid azide 1-hexadecanoyl-2-nonadecanoyl-sn-glycero-3-phosphoethanolamine 3,3′-Thiodinonadecanoic acid The amphipathic material AM may be provided on the first pixel defining layer PDL-B as a monolayer. For example, the second pixel defining layer PDL-T may be a monolayer including the amphipathic material AM. The thickness t of the second pixel defining layer PDL-T may be about 5 nm to about 30 nm. For example, the second pixel defining layer PDL-T may be formed as a monolayer and may have a thickness of about 5 nm to about 10 nm.

The upper surface PDL-TU of the second pixel defining layer PDL-T may exhibit hydrophobicity. For example, the second pixel defining layer PDL-T may be formed by having the amphipathic material AM aligned such that the hydrophobic group HB faces the upper surface PDL-TU.

The surface energy of the upper surface PDL-TU of the second pixel defining layer PDL-T may be about 10 dyne/cm to about 30 dyne/cm. The amphipathic material AM having the hydrophobic group HB having a surface energy of less than about 10 dyne/cm may not be easily prepared, and when the surface energy exceeds about 30 dyne/cm, the second pixel defining layer PDL-T does not have sufficient liquid repellency such that, in the display device DD according to an embodiment manufactured by using a method for manufacturing a display device to be described later, the organic layers OL1, OL2, and OL3 may not exhibit good print quality in the opening OH defined in the pixel defining layer PDL.

The contact angle of water on the upper surface PDL-TU of second pixel defining layer PDL-T may be from about 100 degrees to less than about 180 degrees. For example, the upper surface PDL-TU of the second pixel defining layer PLD-T may be hydrophobic, having a contact angle of about 100 degrees or more with water. For example, in the upper surface PDL-TU of second pixel defining layer PDL-T, the contact angle of water may be between about 100 degrees to about 150 degrees.

A display device according to an embodiment may include a second pixel defining layer including an amphipathic material such that an upper surface of the second pixel defining layer is hydrophobic (or exhibits hydrophobic characteristics). Also, a display device according to an embodiment includes a first pixel defining layer having hydrophilicity and a second pixel defining layer disposed on an upper surface of the first pixel defining layer and including an amphipathic material aligned such that a hydrophobic group is exposed to the outside so as to allow organic layers of an organic electroluminescence device to be disposed uniformly in an opening defined in the first pixel defining layer. As a result, good print quality may be exhibited and high resolution may be realized.

Hereinafter, referring to FIGS. 7, 8A-8G, and 9A-9D, a method for manufacturing a display device according to an embodiment will be described. With respect to a display device to be described with reference to a method for manufacturing the display device according to an embodiment, the same or substantially similar content as that described with reference to FIGS. 1-6B may be applied thereto and may not be repeated.

Figure 7:
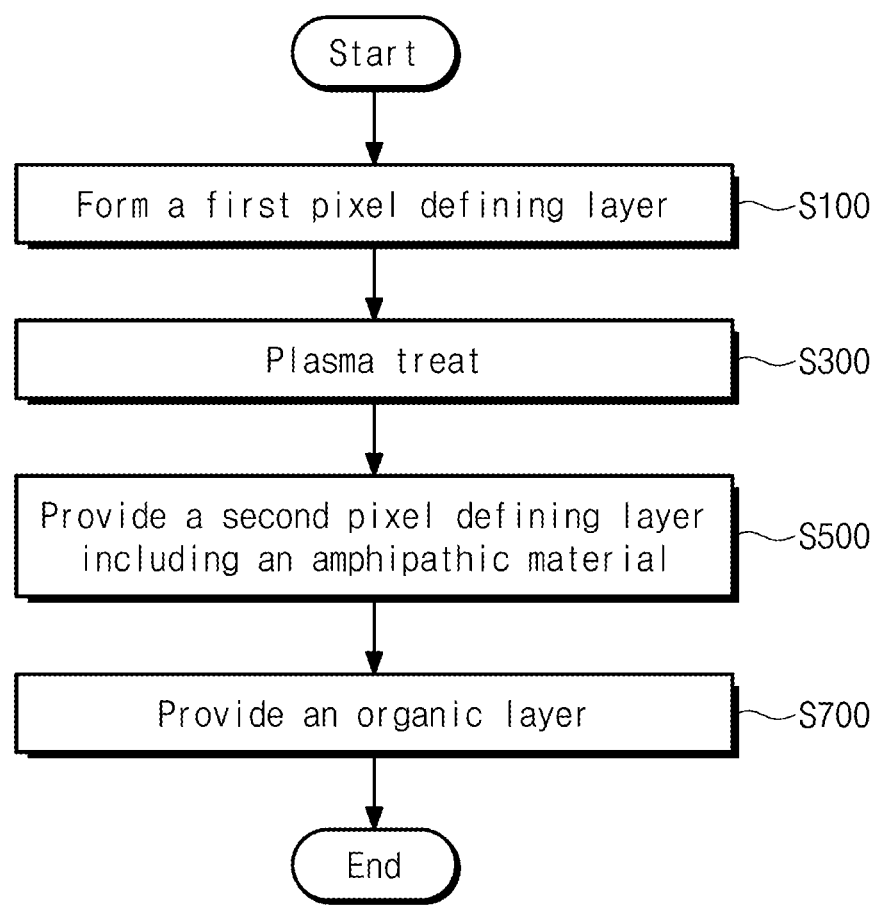
FIG. 7 is a flow chart showing a method for manufacturing a display device according to an embodiment.

FIG. 7 is a flow chart showing a method for manufacturing a display device according to an embodiment, and FIGS. 8A-8G are schematic views sequentially showing steps of a method for manufacturing a display device according to an embodiment. Also, FIGS. 9A-9D are views schematically showing a method for forming a transition monolayer including an amphipathic material provided as a second pixel defining layer.

A method for manufacturing a display device according to an embodiment may include forming a first pixel defining layer S100, plasma treating S300, providing a second pixel defining layer including an amphipathic material S500, and providing an organic layer S700. A method for manufacturing a display device according to an embodiment may further include forming a first electrode on a substrate including a circuit layer before the forming of the first defining layer S100. High-temperature heat treating may be further included after the providing of the second pixel defining layer including an amphipathic material S500.

Figure 8A:
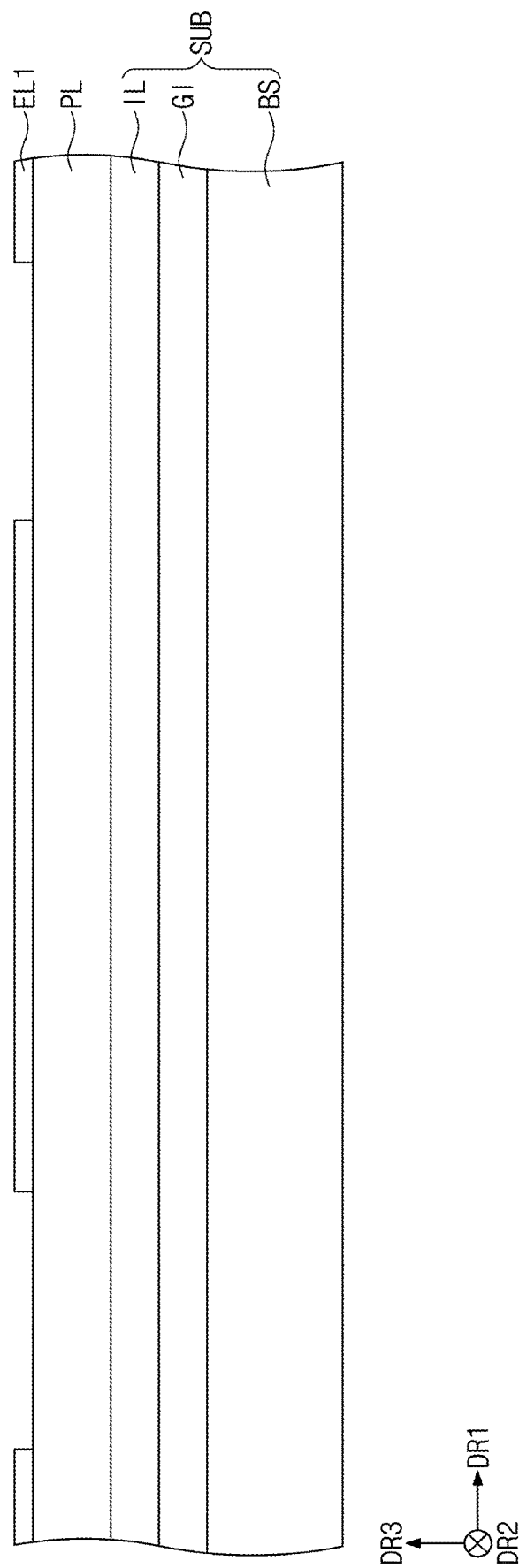

FIG. 8A shows the step of forming the first electrode EL1 on the substrate SUB. The first electrode EU may be formed on the substrate SUB including the gate insulating layer GI, the interlayer insulating layer IL, and the like. In FIG. 8A, the gate insulating layer GI and the interlayer insulating layer IL may be a portion of the circuit layer CL as illustrated in, for example, FIG. 4 and the like. The first electrode EL1 may be formed on the insulating layer PL disposed on the substrate SUB. The first electrode EL1 may be formed by a patterning process.

Figure 8B:
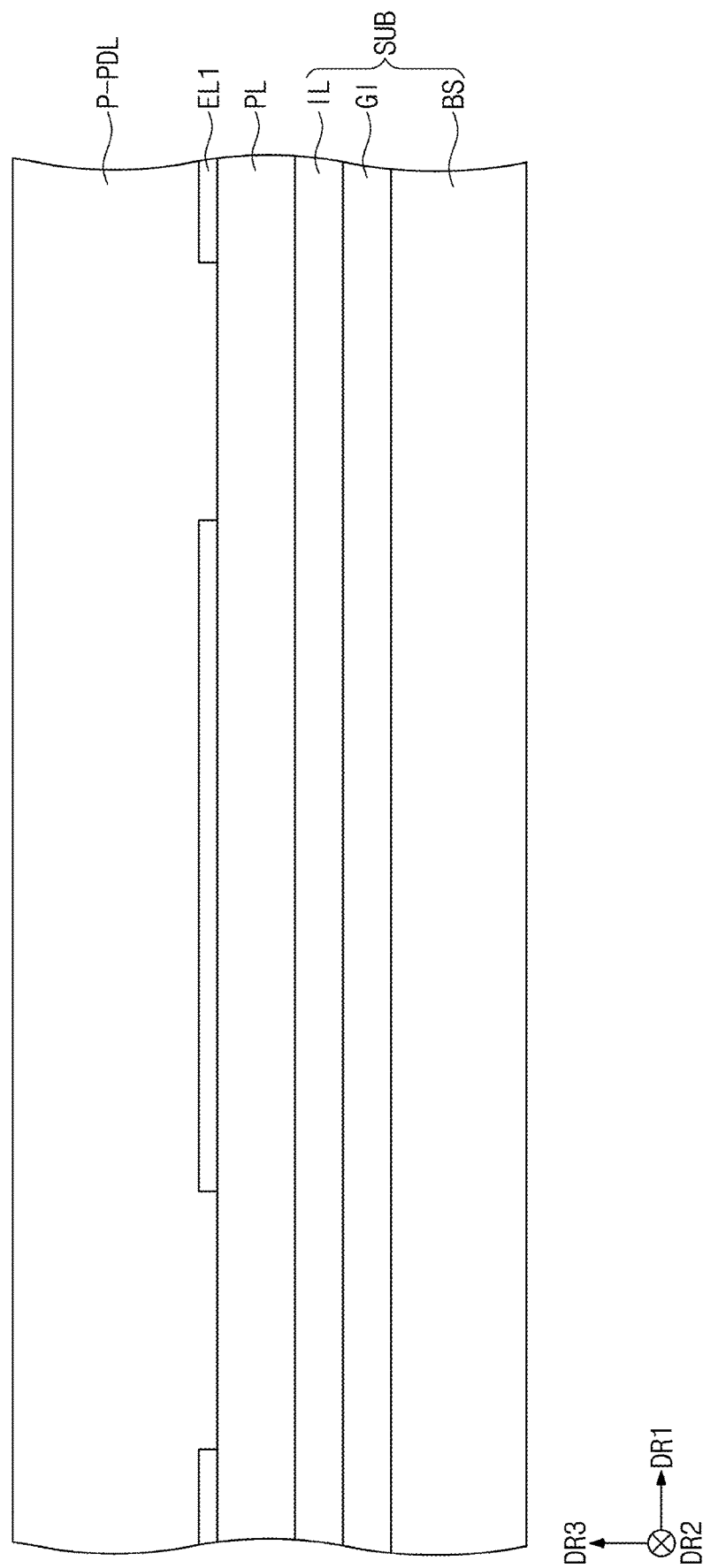

FIG. 8B schematically shows a part of the step of forming the first pixel defining layer S100. FIG. 8B illustrates a step of providing a preliminary pixel defining layer P-PDL for the forming of the first pixel defining layer. In the present specification, the preliminary pixel defining layer P-PDL may be a temporary pixel defining layer before being patterned into the first pixel defining layer PDL-B. As illustrated in FIG. 8B, the preliminary pixel defining layer P-PDL may be provided on the entire substrate SUB on which the first electrode EL1 is formed. After the preliminary pixel defining layer P-PDL is provided, the first pixel defining layer PDL-B having the opening OH may be formed by patterning the preliminary pixel defining layer P-PDL. In the step of forming the first pixel defining layer S100, when the opening OH is formed, the electrode connection opening CH3 (see, e.g., FIG. 4) may be concurrently (or simultaneously) formed in the insulating layer PL. In the step of forming of the first pixel defining layer S100, a mask may be used for patterning the preliminary pixel defining layer P-PDL and the insulating layer PL. To pattern the preliminary pixel defining layer P-PDL and the insulating layer concurrently (or at the same time), a two tone mask may be used.

Figure 8C:
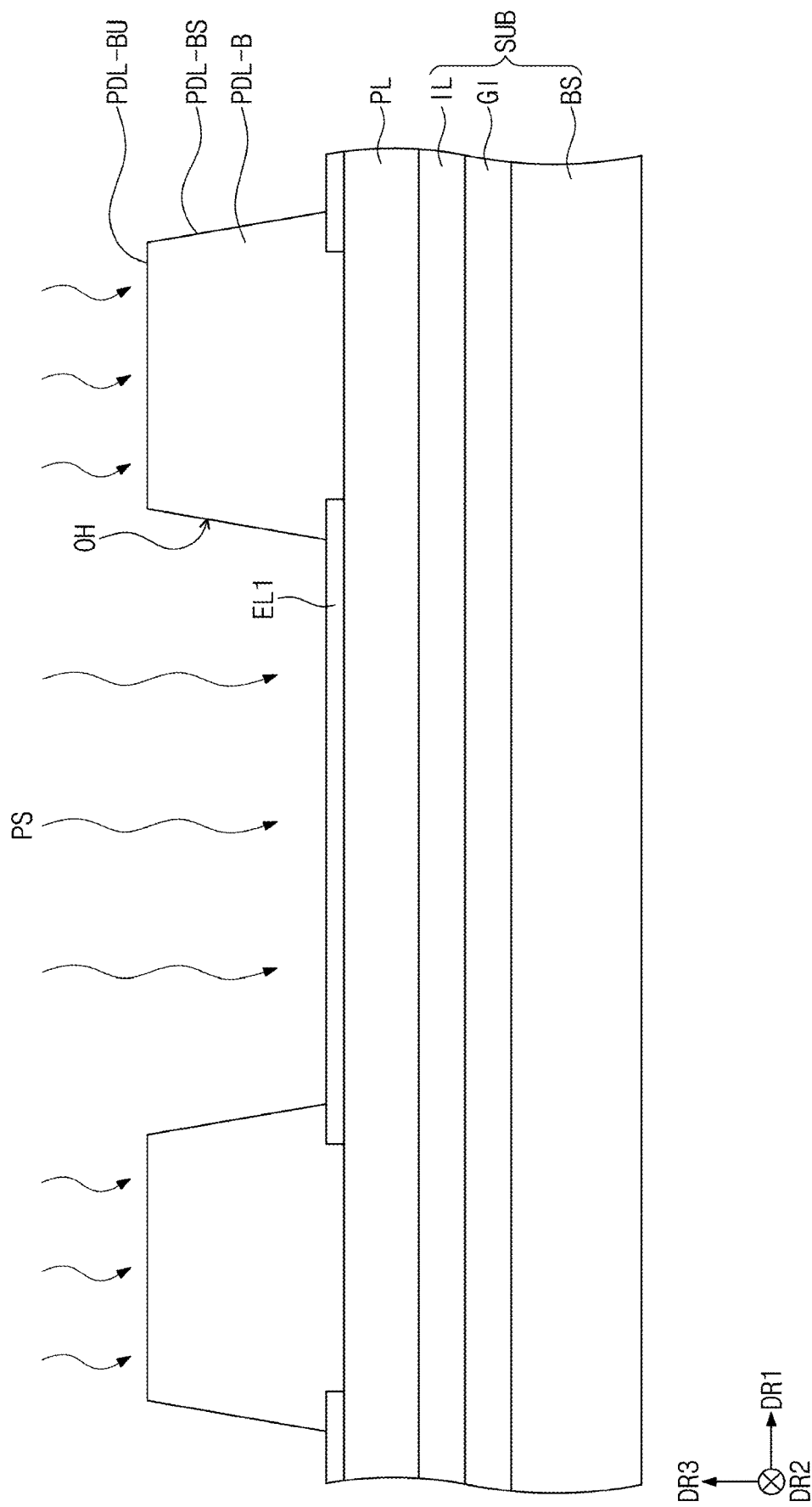

FIG. 8C shows the step of plasma treating S300. The step of plasma treating S300 may include generating plasma PS by using a treatment gas to modify a treated surface. The step of plasma treating S300 may include plasma treating the patterned first pixel defining layer PDL-B and the first electrode EL1 exposed by the opening OH. The step of plasma treating S300 may include a step for removing foreign substances remaining on the surface of the first electrode EL1 and for adjusting the work function of the first electrode EL1. In addition, after the step of plasma treating S300, the surface properties of the first pixel defining layer PDL-B may be changed. For example, after the step of plasma treating S300, the surface of the first pixel defining layer PDL-B may be changed to have hydrophilicity.

The step of plasma treating S300 may include, for example, a step of an oxygen plasma treating. However, embodiments of the present disclosure are not limited thereto, and in the step of plasma treating S300, a plasma treating may be performed by using nitrogen gas, argon gas, and the like as a treatment gas in addition to oxygen gas. In the step of plasma treating S300, different kinds of gases may be mixed and used as the treatment gas. For example, in the step of plasma treating S300, oxygen gas, nitrogen gas, and argon gas may be independently used (e.g., may be used individually) as the treatment gas or a plurality of these gases may be mixed and used as the treatment gas. After the step of plasma treating S300 illustrated in FIG. 8C, the side surface PDL-BS and the upper surface PDL-BU of the first pixel defining layer PDL-B may exhibit hydrophilicity.

FIG. 8D shows the step of providing a second pixel defining layer including an amphipathic material S500 in the method for manufacturing a display device according to an embodiment. Transition monolayers ML-D and ML-T including an amphipathic material may be transferred from a carrier substrate SB to the upper surface PDL-BU of the first pixel defining layer PDL-B. A portion of the transition monolayers ML-D and ML-T may be transferred to the upper surface PDL-BU of the first pixel defining layer PDL-B to form the second pixel defining layer PDL-T.

When a transition monolayer ML-T is transferred from the carrier substrate SB to the first pixel defining layer PDL-B, the transition monolayer ML-T may be transferred such that the hydrophilic group HP of the amphipathic material AM contacts (e.g., is disposed directly on) the upper surface PDL-BU of the first pixel defining layer PDL-B.

FIGS. 9A-9D schematically show a method for forming a transition monolayer including an amphipathic material on a carrier substrate. The method schematically shown in FIGS. 9A-9D for forming the transition monolayer ML-T including an amphipathic material may be the Langmuir-Blodgett method, the Langmuir-Schaefer method, and the like.

Figure 9A:
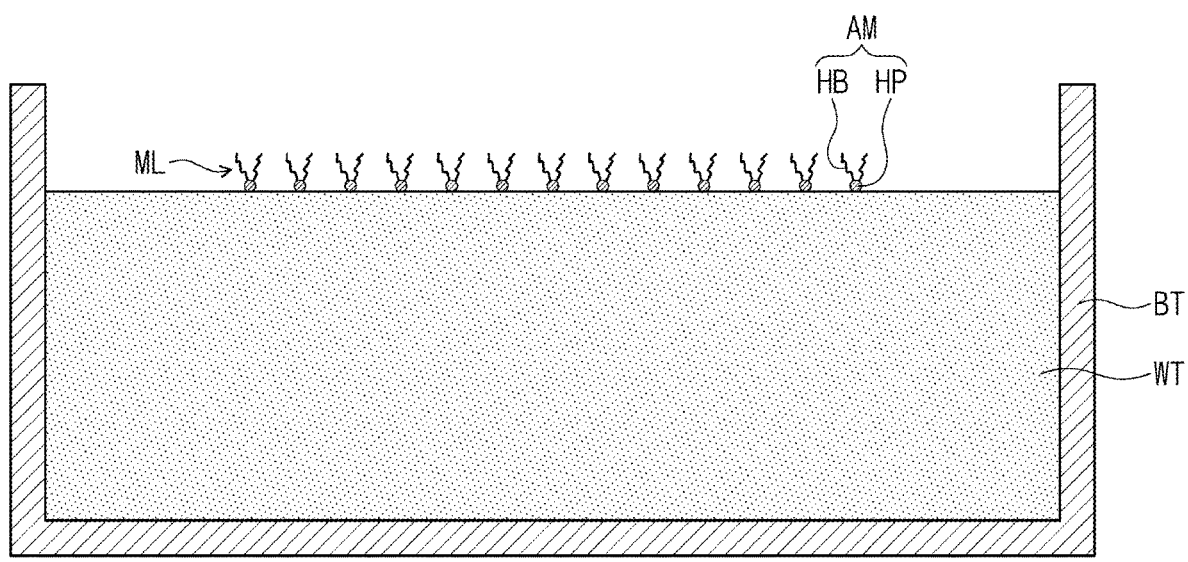
FIGS. 9A-9D are views schematically showing a method for manufacturing a transition monolayer including an amphipathic material.

FIG. 9A shows a step of forming a monolayer ML by aligning the amphipathic material AM on a liquid medium WT filled in a bath BT. Water may be used as the liquid medium WT, and the monolayer ML may be provided on a surface of the water. In FIG. 9A, the amphipathic material AM forming the monolayer ML may be aligned such that the hydrophilic group HP comes into contact with the surface of the medium WT, which may be water, and the hydrophobic group is exposed to the outside.

Figure 9B:
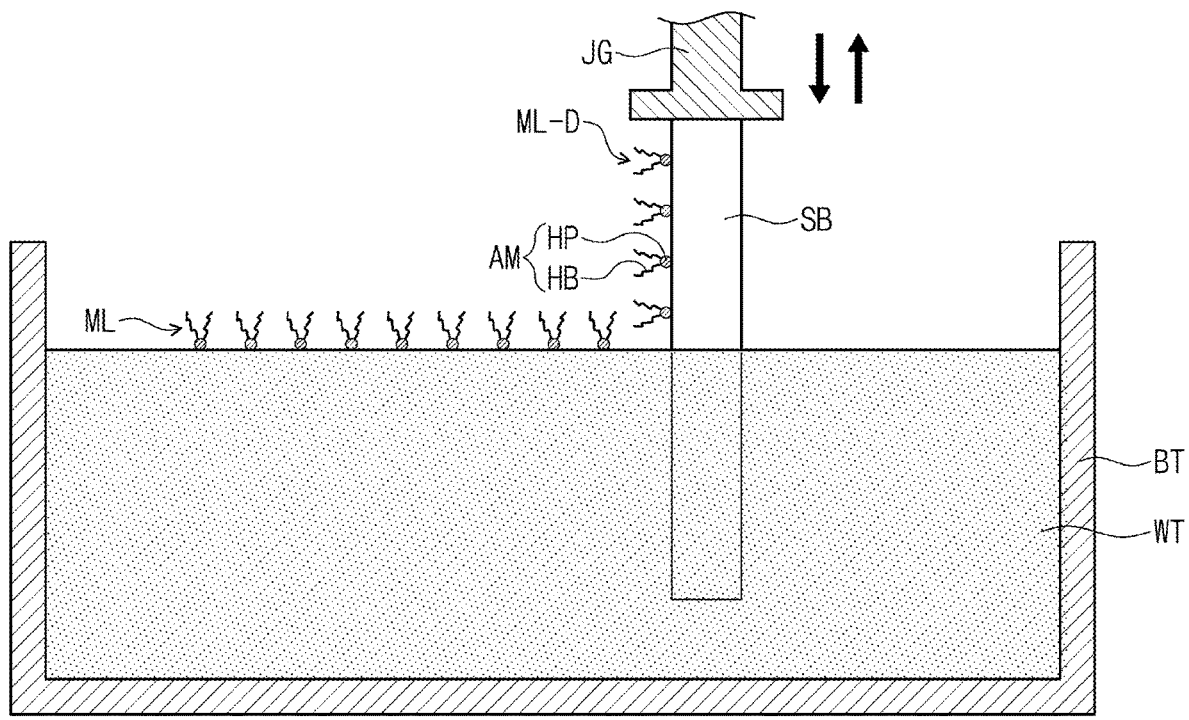

FIG. 9B shows the monolayer ML aligned on the surface of the medium WT moving to the carrier substrate SB. The moving of the monolayer ML to the carrier substrate SB may be performed by controlling the carrier substrate SB to move up and down in the vertical direction crossing the monolayer ML (e.g., normal to the surface of the medium WT) maintained at constant surface pressure on the surface of the medium WT. For example, the carrier substrate SB may be fixed to a jig JG and moved up and down by the jig JG.

A silicon wafer or a polydimethylsiloxane (PDMS) base material may be used as the carrier substrate SB. The monolayer ML may be transferred from the surface of the water onto one surface of the carrier substrate SB as it moves up and down to form a first transition monolayer ML-D. The first transition monolayer ML-D may be the amphipathic materials AM aligned such that the hydrophilic group HP of the amphipathic material AM is attached to the carrier substrate SB.

Figure 9C:
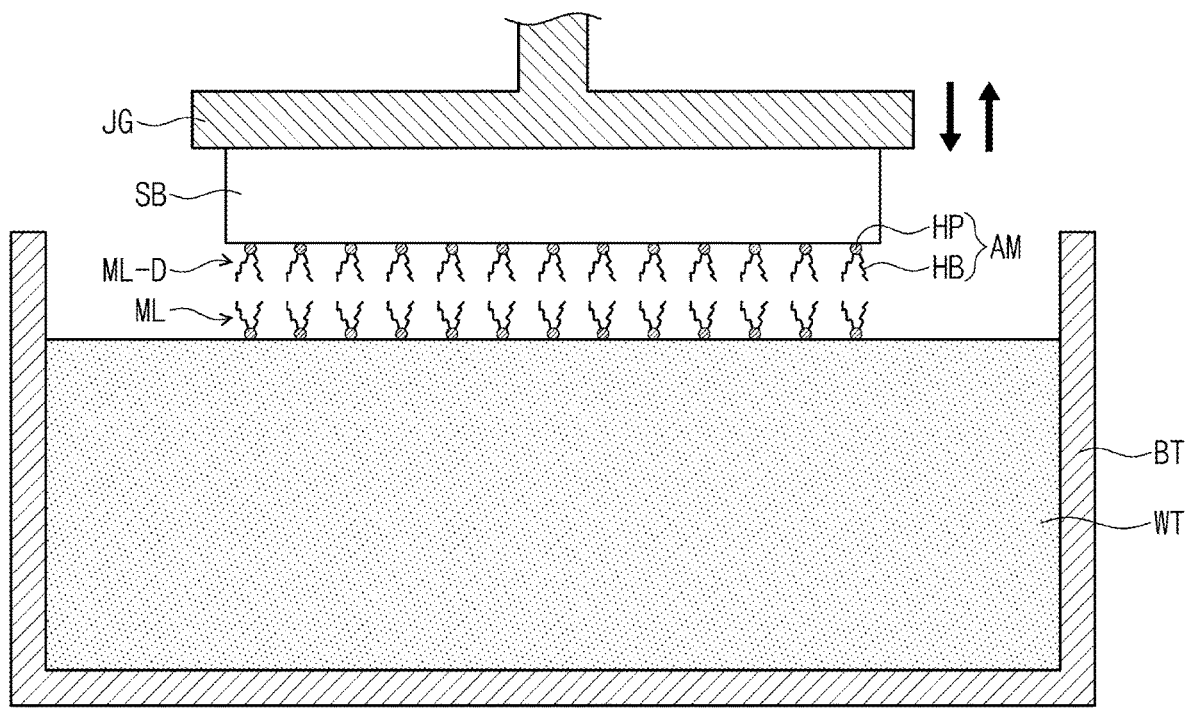

In addition, the plurality of transition monolayers ML-D and ML-T may be provided on the carrier substrate SB. FIG. 9C shows a step of additionally forming a second transition monolayer ML-T on the carrier substrate SB after forming the first transition monolayer ML-D on the carrier substrate SB using the process illustrated in FIG. 9B. Referring to FIG. 9C, the first transition monolayer ML-D is a single layer formed on the carrier substrate SB, and the carrier substrate SB is provided again on the monolayer ML on the surface of the medium WT to form the transition monolayers ML-D and ML-T, which are two layers on the carrier substrate SB.

Figure 9D:
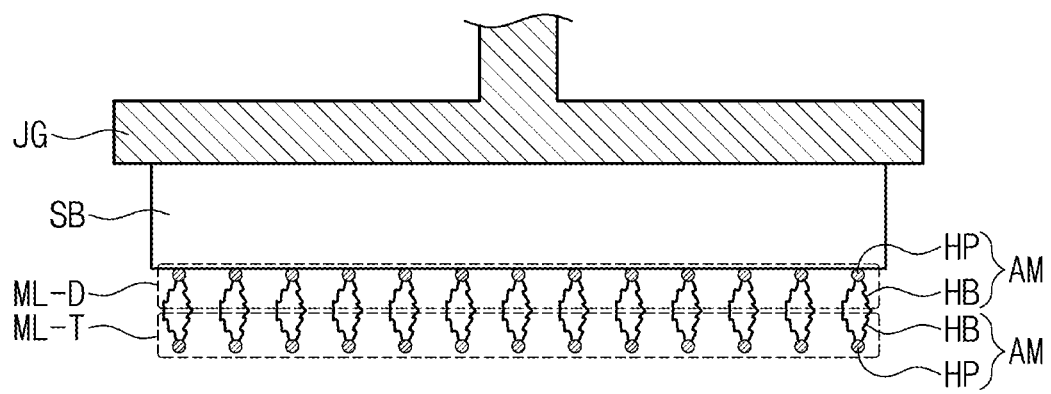

FIG. 9D shows the carrier substrate SB and the transition layers ML-D and ML-T provided as two laminated layers on the carrier substrate SB after the step of transferring the monolayer ML illustrated in FIG. 9C.

Referring to FIG. 9D, in the transition monolayers ML-D and ML-T attached on the carrier substrate SB, the hydrophobic group HP of the amphipathic material AM forming the second transition monolayer ML-T may contact the first transition monolayer ML-D, and in the second transition monolayer ML-T, the hydrophilic group HP of the amphipathic material AM may be exposed to the outside. For example, the carrier substrate SB is used as a support substrate for supporting the plurality of transition monolayers ML-D and ML-T so that a portion of the transition monolayers ML-D and ML-T supported and fixed by the carrier substrate SB may be transferred onto the first pixel defining layer PDL-B as described above.

FIG. 8D shows the step of providing a second pixel defining layer including an amphipathic material S500. The step of providing the second pixel defining layer S500 may include a step of providing the second transition monolayer ML-T onto the first pixel defining layer PDL-B. For example, the step of providing the second pixel defining layer including the amphipathic material S500 may include a step of transferring the monolayer manufactured by the Langmuir-Blodgett method or the Langmuir-Schaefer method, which was described above with reference to FIG. 9D and the like, onto the upper surface PDL-BU of the first pixel defining layer PDL-B. In the step of providing the second pixel defining layer S500, the second transition monolayer ML-T provided on the first pixel defining layer PDL-B may be provided such that the hydrophobic group HP of an amphipathic material is exposed to the outside. Therefore, the upper surface PDL-TU of the second pixel defining layer PDL-T may have hydrophobicity.

In a method for manufacturing a display device according to an embodiment, after the step of plasma treating S300, the surface of the first pixel defining layer PDL-B has hydrophilicity. However, after the step of providing the second pixel defining layer S500, by providing the second pixel defining layer PDL-T including an amphipathic material onto the first pixel defining layer PDL-B, an upper surface of the pixel defining layer PDL may have hydrophobicity. Therefore, when a step of manufacturing an organic electroluminescence device is performed after the second pixel defining layer PDL-T is provided, the organic layer OL may be efficiently provided in the opening OH without being diffused over the pixel defining layer PDL; thus, even if the area of the opening OH is small, the organic layer OL may be provided in the opening OH without overflowing.

A method for manufacturing a display device according to an embodiment may further include a step of high-temperature heat treating after the step of forming the second pixel defining layer including the amphipathic material S500. The step of high-temperature heat treating may be to fix the transferred monolayer including the amphipathic material onto the first pixel defining layer PDL-B.

A method for manufacturing a display device according to an embodiment may further include a step of providing an organic layer in the opening OH in the first pixel defining layer PDL-B S700 after the step of forming the second pixel defining layer including the amphipathic material S500.

Figure 8E:
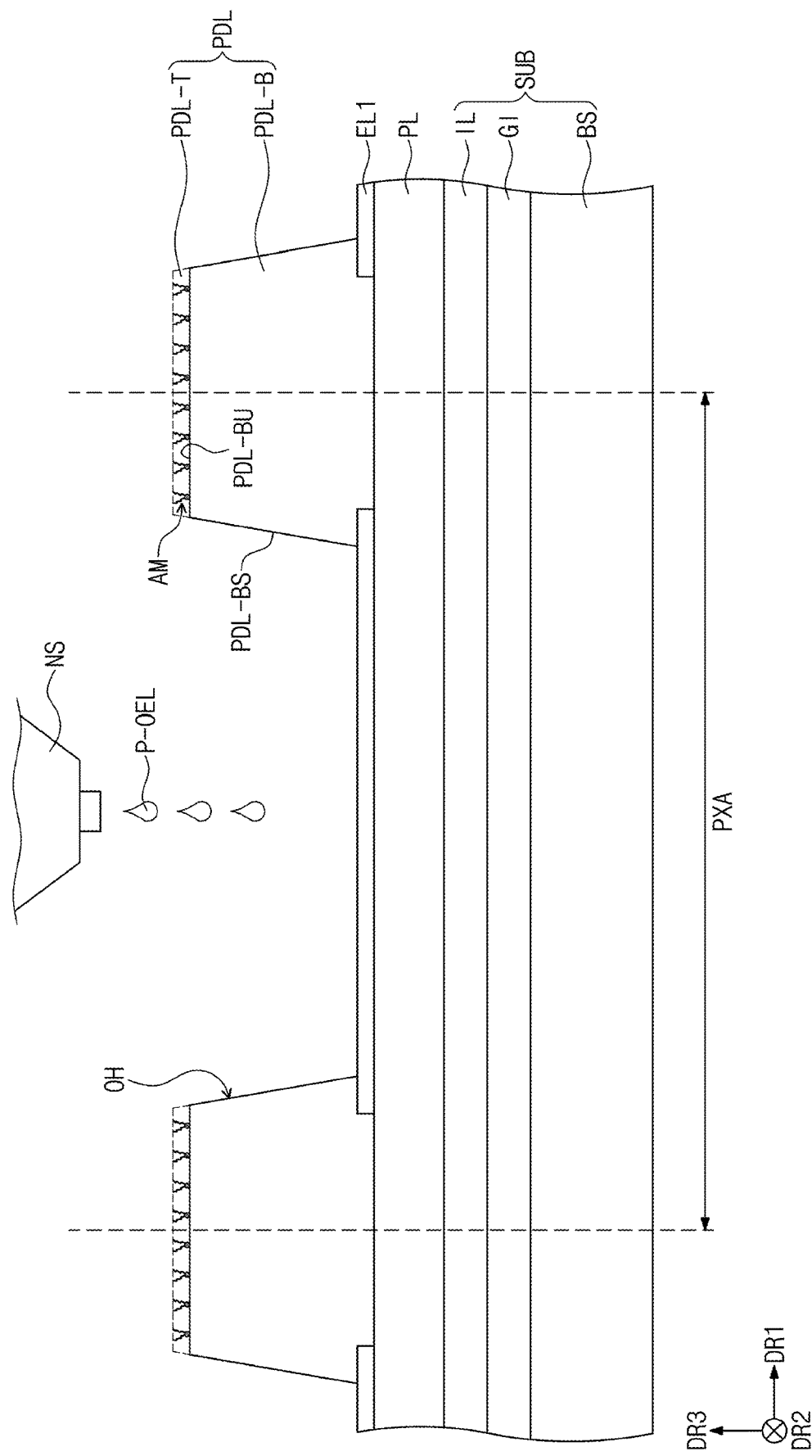

The step of providing an organic layer S700 may include a step of providing an organic layer by a printing method. FIG. 8E is a view schematically showing the step of providing an organic layer S700. FIG. 8E shows a step of providing an organic material P-OEL in the opening OH defined in the pixel defining layer PDL to form an organic layer OL. FIG. 8E schematically illustrates the organic material P-OEL being provided through a nozzle NS, and the organic material P-OEL provided in the opening OH may be provided by an inkjet printing method.

The organic layer OL provided by a printing method may be at least one of the hole transport region HTR or the light emitting layer EML. For example, in a method for manufacturing a display device according to an embodiment, the hole transport region HTR and the light emitting layer EML may be formed of or may include the organic material P-OEL in the form of ink provided by a printing method. The organic material in the form of ink is not spread on the second pixel defining layer PDL-T due to the hydrophobic nature of the upper surface PDL-TU of the second pixel defining layer PDL-T and may exhibit good wetting properties to the first electrode EL1 and in the opening OH in the first pixel defining layer due to the hydrophilic nature of the first pixel defining layer PDL-B. For example, in a method for manufacturing a display device according to an embodiment, the first pixel defining layer PDL-B having hydrophilic surface properties is formed and the second pixel defining layer PDL-T having an amphipathic material is provided on the first pixel defining layer PDL-B such that the upper surface PDL-TU of the second pixel defining layer PDL-T has hydrophobicity. The organic layers OL included in an organic electroluminescence device may be uniformly printed in the opening OH. In addition, the organic material P-OEL may not overflow into a neighboring pixel region beyond the opening OH (e.g., the desired or targeted opening OH) in the pixel defining layer PDL.

Therefore, by using a method for manufacturing a display device according to an embodiment including a step of forming the first pixel defining layer PDL-B having hydrophilicity and the second pixel defining layer PDL-T having a hydrophobic upper surface, the organic layers may be effectively disposed in a partitioned pixel region PXA, and as a result, a high resolution display device may be manufactured.

Figure 8F:
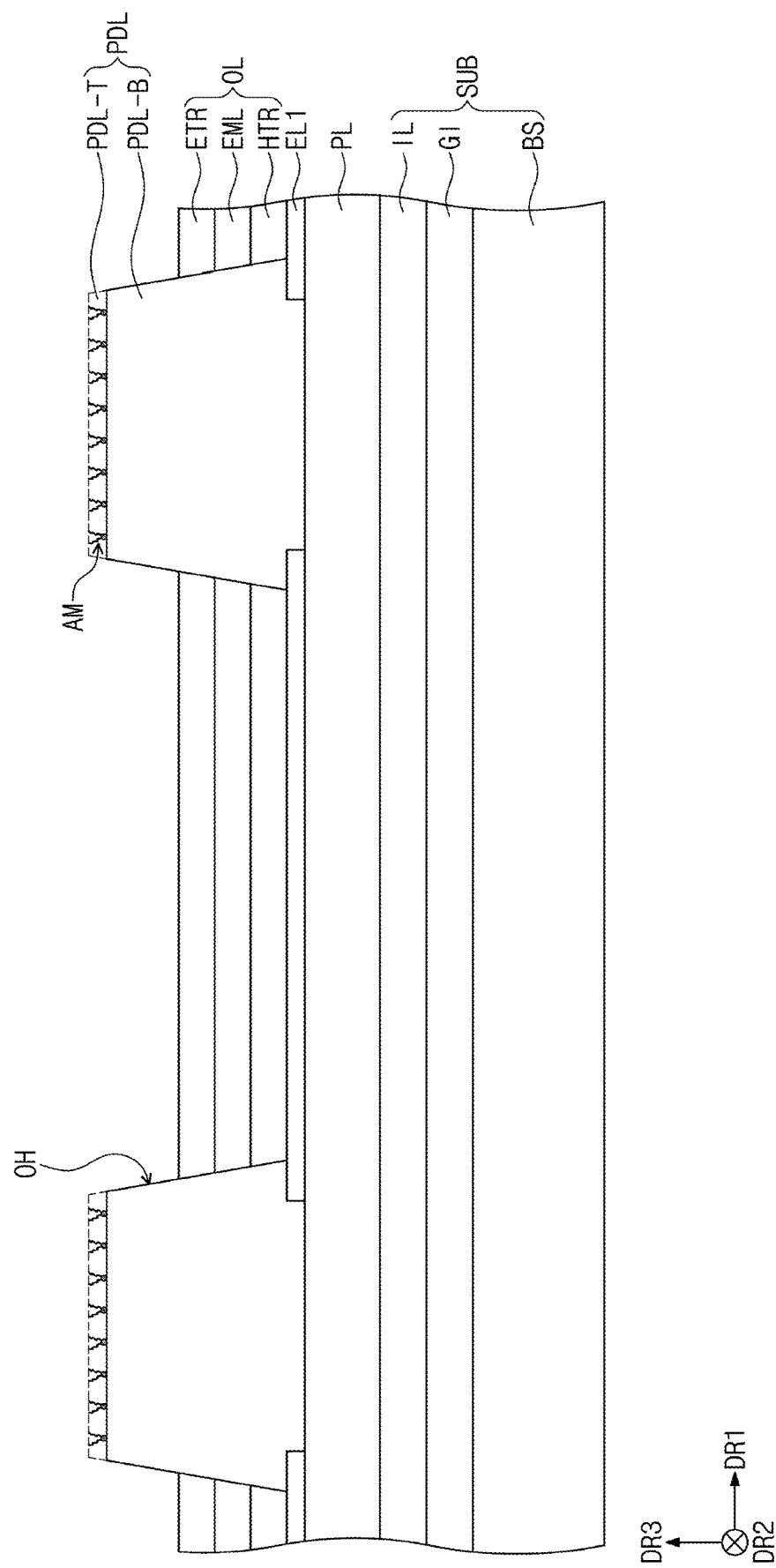

FIG. 8F shows a state in which the organic layer OL is formed in the opening OH. In a method for manufacturing a display device according to an embodiment, the hole transport region HTR and the light emitting layer EML may be provided by a printing method, and the electron transport region may be provided by a deposition method.

FIG. 8G is a cross-sectional view of the display device DD manufactured by a method for manufacturing a display device according to an embodiment. After the step of forming the organic layer S700 illustrated in FIG. 8F, a step of forming the second electrode EL2 on the organic layer OL and a step of forming the sealing layer SL sealing the organic electroluminescence device OEL may be performed. The second electrode EL2 is disposed on the organic layer OL and may extend onto the pixel defining layer PDL. For example, the second electrode EL2 may be formed to overlap not only the first electrode EL1 but also the first pixel defining layer PDL-B and the second pixel defining layer PDL-T.

A method for manufacturing a display device according to an embodiment includes a step of providing a second pixel defining layer including an amphipathic material on an upper surface of a first pixel defining layer modified to be hydrophilic after a step of plasma treating such that an upper surface of the pixel defining layer including the first and second pixel defining layers is modified to be hydrophobic. Accordingly, an organic electroluminescence device may be more easily manufactured using a printing method. For example, a method for manufacturing a display device according to an embodiment allows an opening provided with an organic layer of an organic electroluminescence device to be hydrophilic thereinside and allows an upper surface of a pixel defining layer partitioning a pixel region to have hydrophobicity so that the bonding strength of the organic layers to a first electrode in the opening is increased and the organic layers are not diffused into neighboring pixels. As a result, a display device with improved display quality is provided. In addition, a method for manufacturing a display device according to an embodiment includes a pixel defining layer having a hydrophobic upper surface to more easily control the flow of organic materials provided in a printing process and, thus, improves productivity.

The above-described example embodiments are to be considered illustrative and not restrictive, and the appended claims are intended to cover all such modifications, enhancements, equivalents, and other embodiments that fall within the spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

What is claimed is:

1. A display device comprising:
    a substrate comprising a circuit layer;
    a first electrode on the substrate;
    a first pixel defining layer on the substrate and having an opening exposing an upper surface of the first electrode;
    a second pixel defining layer on the first pixel defining layer and comprising an amphipathic material;
    an organic layer on the first electrode, an upper surface of the organic layer being below a bottom surface of the second pixel defining layer with respect to the substrate; and
    a second electrode on the organic layer.

2. The display device of claim 1, wherein the second pixel defining layer is on an upper surface of the first pixel defining layer.

3. The display device of claim 1, wherein the amphipathic material comprises a hydrophilic group and a hydrophobic group, and
    wherein the hydrophilic group contacts the upper surface of the first pixel defining layer and the hydrophobic group defines an upper surface of the second pixel defining layer.

4. The display device of claim 1, wherein a surface energy of the upper surface of the second pixel defining layer is in a range of 10 dyne/cm to 30 dyne/cm.

5. The display device of claim 1, wherein a contact angle of water on the upper surface of the second pixel defining layer is in a range of 100 degrees to 180 degrees.

6. The display device of claim 1, wherein a thickness of the second pixel defining layer is in a range of 5 nm to 30 nm.

7. The display device of claim 1, wherein the organic layer comprises a light emitting layer.

8. The display device of claim 1, wherein the first pixel defining layer comprises a hydrophilic material.

9. The display device of claim 1, wherein the organic layer is in the opening, and
    wherein the organic layer comprises a hole transport region, a light emitting layer on the hole transport region, and an electron transport region on the light emitting layer.

10. The display device of claim 1, wherein the second electrode extends onto the first pixel defining layer and the second pixel defining layer.

11. A display device comprising:
    a substrate comprising a circuit layer;
    a first electrode on the substrate;
    a first pixel defining layer on the substrate and having an opening exposing an upper surface of the first electrode;

a second pixel defining layer on the first pixel defining layer and comprising an amphipathic material;
an organic layer on the first electrode; and
a second electrode on the organic layer,
wherein the second pixel defining layer is a monolayer comprising the amphipathic material.

12. A display device comprising:
a plurality of organic electroluminescence devices, each of the organic electroluminescence devices comprising a first electrode, a second electrode facing the first electrode, and a light emitting layer between the first electrode and the second electrode; and
a pixel defining layer between the organic electroluminescence devices and defining a plurality of pixel regions, the pixel defining layer comprising:
   a first pixel defining layer having a hydrophilic side surface and a hydrophilic upper surface; and
   a second pixel defining layer on the first pixel defining layer, the second pixel defining layer comprising an amphipathic material, an upper surface of the second pixel defining layer being hydrophobic,
wherein an upper surface of the light emitting layer is below a bottom surface of the second pixel defining layer.

13. The display device of claim 12, wherein the amphipathic material comprises a hydrophilic group and a hydrophobic group, and
wherein the hydrophilic group contacts the upper surface of the first pixel defining layer.

* * * * *